(12) United States Patent
Sasago et al.

(10) Patent No.: US 7,767,997 B2
(45) Date of Patent: Aug. 3, 2010

(54) SEMICONDUCTOR DEVICE WITH SOLID ELECTROLYTE SWITCHING

(75) Inventors: Yoshitaka Sasago, Tachikawa (JP); Motoyasu Terao, Hinode (JP); Norikatsu Takaura, Tokyo (JP); Yoshihisa Fujisaki, Hachioji (JP); Tomoyuki Kodama, Kokubunji (JP); Nobuyuki Arasawa, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 12/169,818

(22) Filed: Jul. 9, 2008

(65) Prior Publication Data

US 2009/0014708 A1 Jan. 15, 2009

(30) Foreign Application Priority Data

Jul. 12, 2007 (JP) .............................. 2007-183478

(51) Int. Cl.
*H01L 29/06* (2006.01)
*H01L 29/08* (2006.01)

(52) U.S. Cl. .................. 257/39; 257/537; 257/E27.006
(58) Field of Classification Search .................. 257/39, 257/537, E27.006
See application file for complete search history.

(56) References Cited

U.S. PATENT DOCUMENTS

| | | | |
|---|---|---|---|
| 2006/0071244 A1* | 4/2006 | Gutsche et al. | 257/250 |
| 2006/0164880 A1* | 7/2006 | Sakamoto et al. | 365/153 |
| 2006/0221555 A1* | 10/2006 | Pinnow | 361/525 |
| 2009/0020742 A1* | 1/2009 | Sunamura et al. | 257/4 |

OTHER PUBLICATIONS

Sakamoto et al. "A Nonvolatile Programmable Solid Electrolyte Nanometer Switch", IEEE International Solid-State Circuits Conference, 2004, Session 16, paper 16.3.
Hawkins et al. "On Intelligence", Times Books, 2004, pp. 23-39.
Tanaka et al., "A CMOS circuit for STDP with a symmetric time window", Brain-Inspired IT III, vol. 1301, pp. 152-155, Jul. 2007.
Kohno "Introductory Lecture of Brain Science", Institute of Industrial Science, University of Tokyo, Japan, Neuromorphic hardwares, Nov. 30, 2007, p. 18.

* cited by examiner

*Primary Examiner*—Ngan Ngo
(74) *Attorney, Agent, or Firm*—Miles & Stockbridge P.C.

(57) ABSTRACT

A nonvolatile, sophisticated semiconductor device with a small surface area and a simple structure capable of switching connections between three or more electrodes. In a semiconductor device at least one of the electrodes contains atoms such as copper or silver in the solid electrolyte capable of easily moving within the solid electrolyte, and those electrodes face each other and applying a voltage switches the voltage on and off by generating or annihilating the conductive path between the electrodes. Moreover applying a voltage to a separate third electrode can annihilate the conductive path formed between two electrodes without applying a voltage to the two electrode joined by the conductive path.

11 Claims, 37 Drawing Sheets

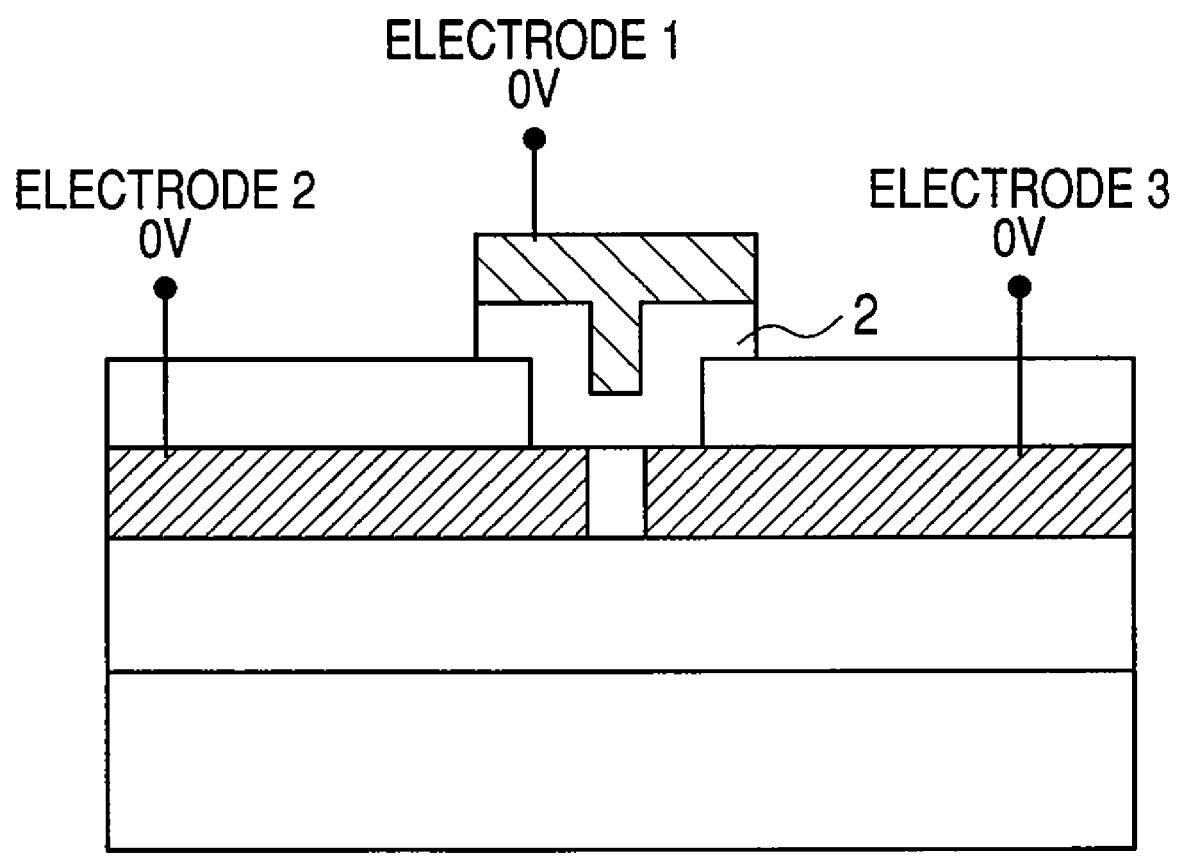

A-A CROSS SECTION

A-A CROSS SECTION

A-A CROSS SECTION

A-O-C CROSS SECTION

A-O-B CROSS SECTION

A-C CROSS SECTION

A-C CROSS SECTION

A-C CROSS SECTION

A-O-B CROSS SECTION

A-O-B CROSS SECTION

A-O-B CROSS SECTION

A-O-B CROSS SECTION

A-O-B CROSS SECTION

B-B CROSS SECTION

B-B CROSS SECTION

B-B CROSS SECTION

A-A CROSS SECTION

B-B CROSS SECTION

A-A CROSS SECTION

A-A CROSS SECTION

SEMICONDUCTOR DEVICE WITH SOLID ELECTROLYTE SWITCHING

CLAIM OF PRIORITY

The present application claims priority from Japanese patent application JP 2007-183478 filed on Jul. 12, 2007, the contents of which are hereby incorporated by reference into this application.

FIELD OF THE INVENTION

The present invention relates to a semiconductor device and relates in particular to a semiconductor device with technology and applications for implementing a high-performance and highly-integrated nonvolatile logic device capable of electrical switching, and possessing the logic decision functions and memory approximating a human brain.

BACKGROUND OF THE INVENTION

Conventional CMOS logic devices have the disadvantages of a large surface area and that the circuit resets when the power is off. The text in International Solid-State Circuits Conference, 2004, p. 290-529 on the other hand, discloses a method for resolving the above disadvantage with a cross bus switch serving a one example of the logic device whose structural elements made up of path transistors and SRAM. The text in International Solid-State Circuits Conference, 2004, p. 290-529 proposes substituting a nonvolatile, solid-state electrolytic nanoswitch for the volatile SRAM section with its large surface area.

One potential application of increasingly sophisticated logic devices is in neural networks (Jeff Hawkins and Sandra Blakeslee, "On Intelligence", pp. 23-39, Times Books (2004); and Hideki Tanaka, Takashi Morie, and Kazuyuki Aihara, A CMOS circuit for STDP with a symmetric time window, Brain-Inspired IT III, Volume 1301, pp, 152-155, July 2007) that attempt to achieve artificial intelligence. The human brain possesses higher ranking functions such as swift decision making based on experience and storing of just essential items that are impossible for the latest advanced computers to achieve. Conventional technology attempted to achieve these types of functions by neural networks but attempts made up to now have not achieved the desired results.

SUMMARY OF THE INVENTION

The neural network learns and stores by changing the strength of wiring connections between cells. As seen from a hardware perspective, the conventional neural network requires complex connections between cells and therefore a large scale network required for advanced functions was impossible to attain via hardware.

An objective of this invention is to provide a logic device possessing a simple structure capable of switching between three or more electrodes, and able to implement large-scale logic within a small surface area.

Other objectives of this invention as well as its novel features will become apparent from the description in the specifications and the appended drawings.

A brief overall description of the representative aspects of this invention as disclosed in these specifications is as follows.

The semiconductor device of this invention switches between the opposing electrodes via the solid electrolyte (film) by applying a voltage to generate or annihilate conductive paths of metallic filament within the solid electrolyte. Also, among the opposing electrodes in the solid electrolyte, the semiconductor device of this invention utilizes three or more electrodes unlike the semiconductor devices of the related art that use two electrodes. Moreover at least three of these three electrodes are spaced at the same distance from each other. Further, among the electrodes facing each other in the solid electrolyte, one of the electrodes contains atoms of copper or silver which can easily move within the solid electrolyte, or contains a high concentration of atoms such as copper or silver in a portion of the solid electrolyte that can move easily within the solid electrolyte.

The semiconductor device of this invention applies a voltage across the corresponding electrodes to perform the switching operation. Namely, by setting the electrode containing atoms such as copper or silver that move easily within the solid electrolyte, or the electrode near the section of the solid electrolyte containing atoms such as copper or silver that move easily within the solid electrolyte, as the positive electrode, a conductive path for electrons is generated by way of a filament made of metal in the solid electrolyte so that the switch is turned on (switch-on state). The switch can be turned off (switch-off state) by applying a voltage of a reverse polarity. In addition to switching by applying a voltage between two terminals using a solid electrolyte as in the related art, the semiconductor device of this invention is capable of operation to eliminate the conductive path between two terminals by just applying a voltage potential to a third electrode.

The effect rendered by the representative aspects of the invention disclosed in these specifications can be described simply as follows.

This invention allows fabricating logic devices with a formerly complex structure as devices with a simple structure by using a solid electrolyte so that production costs can be lowered because the device has a smaller surface area. Moreover, these simple structure devices can be fabricated on a large circuit scale to allow advanced functions of a human brain such as instantaneous recognition and decision making.

BRIEF DESCRIPTION OF THE DRAWINGS

FIG. 3 is a fragmentary cross sectional view (along line A-A of FIG. 1) showing the switch-off state of the semiconductor device of the first embodiment of this invention;

FIG. 12B is a cross sectional view taken along lines A-A of FIG. 12A;

DETAILED DESCRIPTION OF THE PREFERRED EMBODIMENTS

Figure 1:
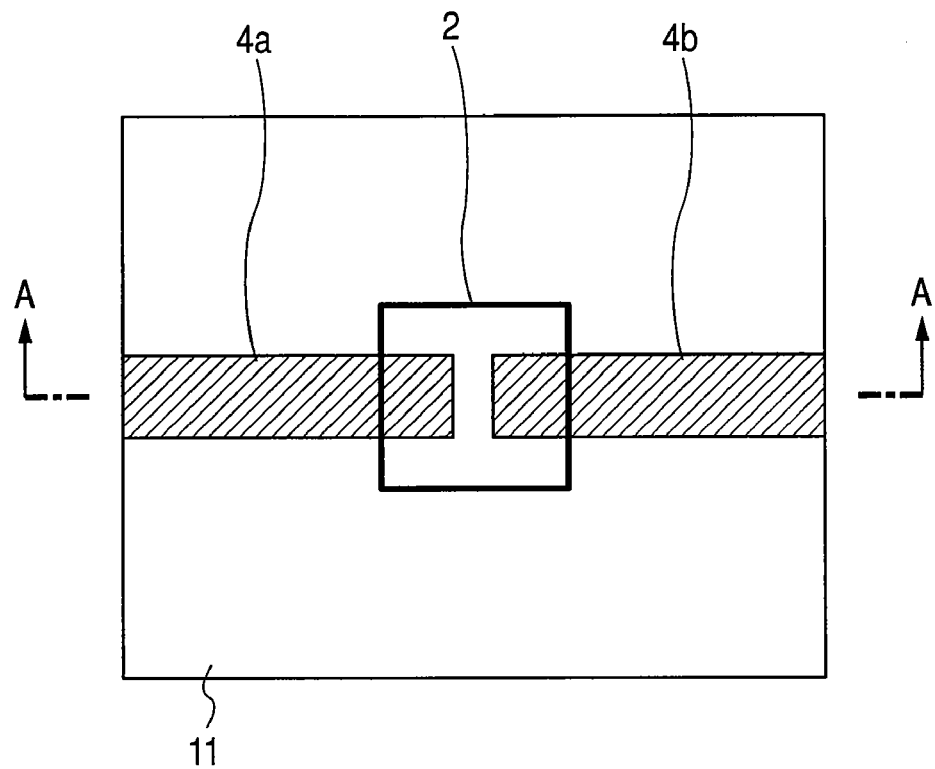
FIG. 1 is a fragmentary flat view showing one example of the semiconductor device of the first embodiment and the second embodiment of this invention.

The embodiments of this invention are described next in detail while referring to the drawings. In all drawings for describing the embodiments, the same reference numerals are assigned to the same functions so repeated descriptions are omitted.

First Embodiment

Figure 2:
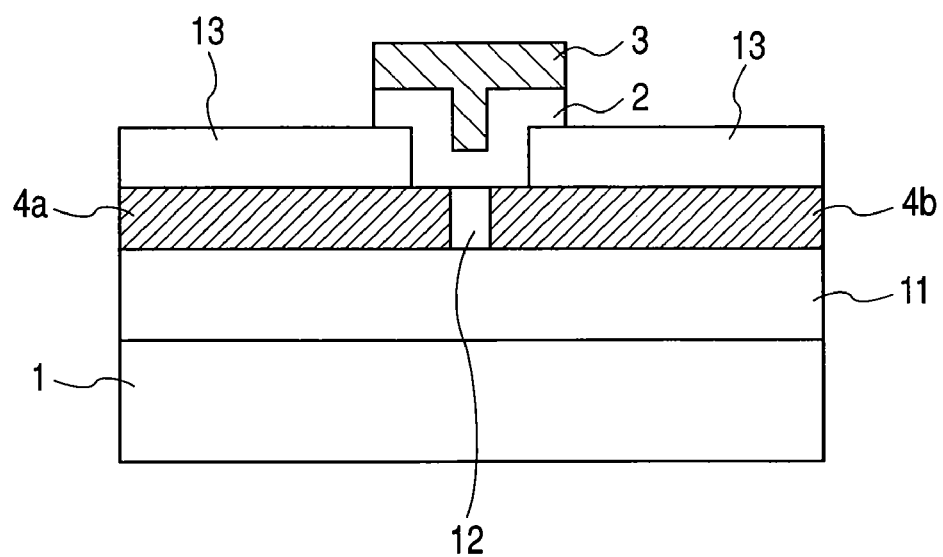
FIG. 2 is a fragmentary cross sectional view (along line A-A of FIG. 1) showing the semiconductor device of the first embodiment of this invention.

FIG. 1 is a plan view showing one example of the semiconductor device of the first embodiment of this invention. FIG. 2 is a cross sectional view taken along lines A-A of FIG. 1. A portion of the structural members are omitted from the flat view in FIG. 1 to make the drawing easier to view.

The semiconductor device of this embodiment is a switching device utilizing a phenomenon to turn on a switch (switch-on) by forming a tiny conductive path of metallic ions such as copper in a solid electrolyte material with high electrical resistance, and turn off a switch (switch-off) by eliminating the conductive path that was formed. The conductive path is generated or eliminated by causing by applying a voltage across the electrodes to cause movement of metallic ions such as copper (Cu) in the solid electrolyte material. This semiconductor device contains the electrodes 4a, 4b formed of tungsten over the insulator film 11; and an insulator film 12 between those electrodes 4a, 4b; a solid electrolyte 2 formed over the electrodes 4a, 4b and insulator film 12; and a copper (Cu) electrode 3 formed on the upper section of solid electrolyte 2, and an insulator film 13 formed so that the copper electrode 3 is in close proximity to the electrodes 4a, 4b by way of the solid electrolyte 2 within an extremely small area.

To describe the operation of the semiconductor device of this embodiment, the electrodes are defined as electrodes 1, 2, 3 as shown in FIG. 3. In FIG. 3, the three electrodes are all at zero volts and in a state where no conductive path was generated by the copper (Cu) in the solid electrolyte 2.

Figure 4A:
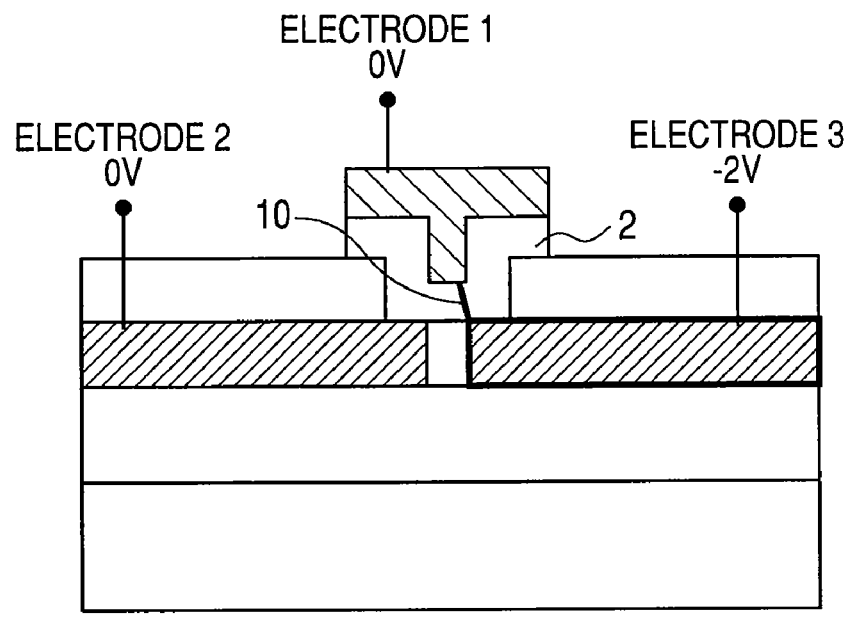
FIG. 4A is a fragmentary cross sectional view (along line A-A of FIG. 1) showing the switch-on state of semiconductor device of the first embodiment of this invention.
Figure 4B:
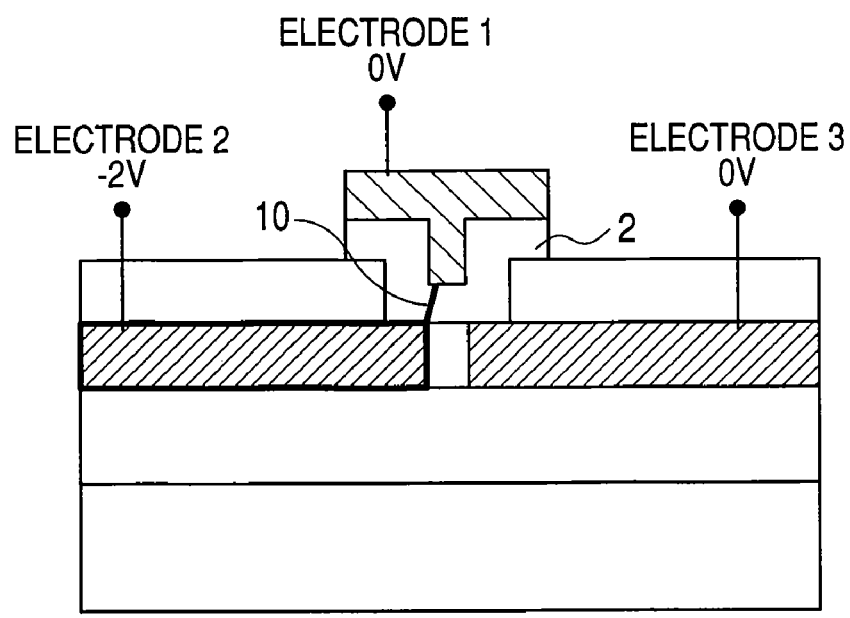
FIG. 4B is a fragmentary cross sectional view (along line A-A of FIG. 1) showing the switch-on state of the semiconductor device of the first embodiment of this invention.

In order to generate a conductive path across the electrodes while starting from the state in FIG. 3, a difference in voltage potentials between the electrode 1 and the electrode 3 is generated by applying 0 volts to the electrodes 1, 2, and −2 volts to the electrode 3 as shown in FIG. 4A. A portion of the copper atoms in the electrode 1 (Copper electrode 3) move towards the electrode 3 due to the positively ionizing the copper ions ($Cu^+$) at the boundary with the solid electrolyte 2, and the electrical field generated in the solid electrolyte. As this reaction progresses the copper atoms in the solid electrolyte form a filament. This filament forms a conductive path 10 of electrons when the copper filament links the electrode 1 with the electrode 3, and the electrical current between the electrode 1 and the electrode 3 drastically increases. This status is the switch-on state. The conductive path 10 that was generated continues to be nonvolatile even if the voltage potential on the electrode 3 is zero. When a voltage of approximately −2 volts is applied to the electrode 2 as shown in FIG. 4B, from the state in FIG. 3, a switch-on state is formed between the electrode 1 and the electrode 2 by the conductive path 10.

Conversely, in order to cut off the conductive path 10 that was generated in FIG. 4A, the electrodes 1, 2 are set to zero volts and the electrode 3 to +2 volts. The copper atoms forming the filament are then positively ionized ($Cu^+$) and move towards the electrode 1 in the solid electrolyte 2 due to the electrical field. The atoms reaching the surface of the electrode 1 return from the Cu+ state to the Cu state and form a portion of the electrode 1. As this reaction progresses the copper atoms forming the filament decrease and finally cut off or eliminate the filament. The flow of electrical current drops sharply between electrode 1 and electrode 3 since there is no conductive path for the electron flow. This status is the switch-off state. This switch-off state where there is no conductive path is maintained even if the voltage on electrode 3 is zero volts. When as shown in FIG. 5B, a voltage potential of +2 volts is applied to the electrode 2 in the same way from the state shown in FIG. 4B, the conductive path 10 formed between the electrode 1 and electrode 2 is cut off, forming the switch-off state.

Figure 5A:
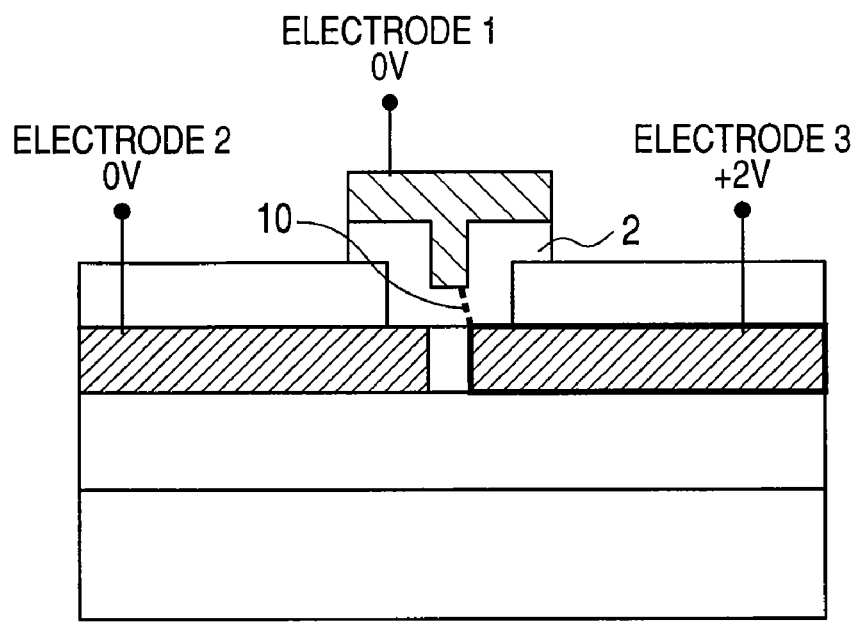
FIG. 5A is a fragmentary cross sectional view (along line A-A of FIG. 1) showing the switch-off state of the semiconductor device of the first embodiment of this invention.
Figure 5B:
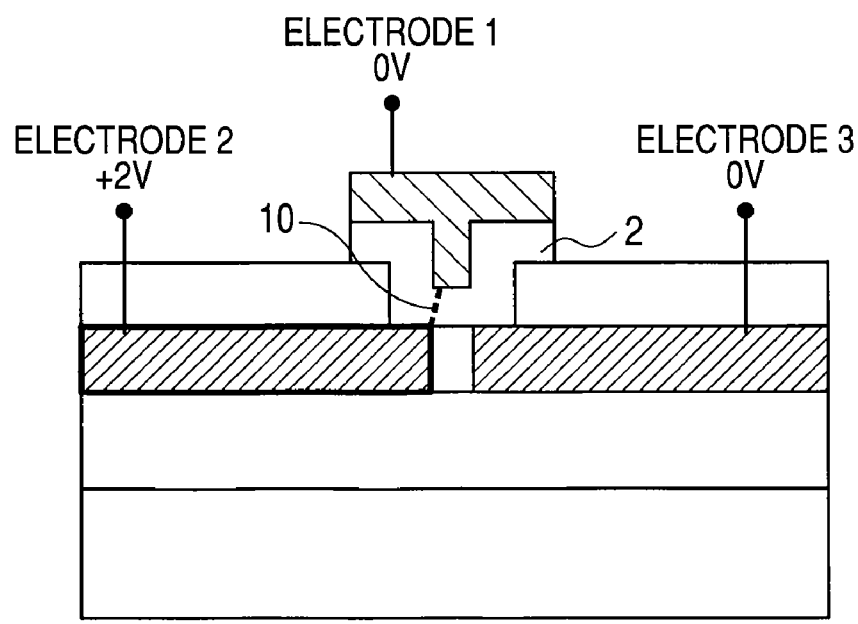
FIG. 5B is a fragmentary cross sectional view (along line A-A of FIG. 1) showing the switch-off state of the semiconductor device of the first embodiment of this invention.

In addition to the switch-on/switch-off state between only the two electrodes as in FIG. 4 and FIG. 5, when the distances between the electrode 1 to electrode 2, the electrode 1 to electrode 3, the electrode 2 to electrode 3 are all equal such as several dozen nanometers for example, then an operation utilizing an interference phenomenon between electrodes becomes possible.

Figure 6A:
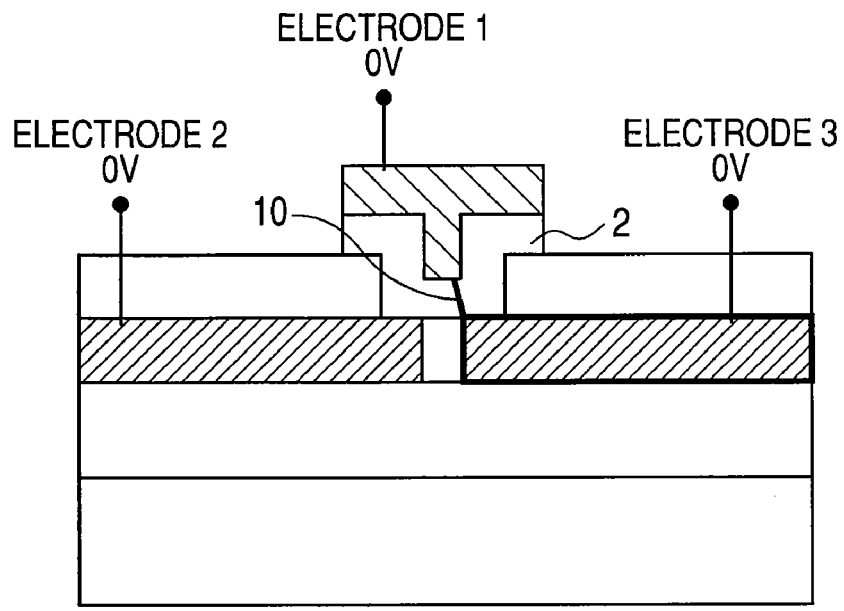
FIG. 6A is a fragmentary cross sectional view (along lines A-A of FIG. 1) showing the ON state between the electrode 1-electrode 3, and the OFF state between the electrode 1-electrode 2 in the semiconductor device of the first embodiment of this invention.
Figure 6B:
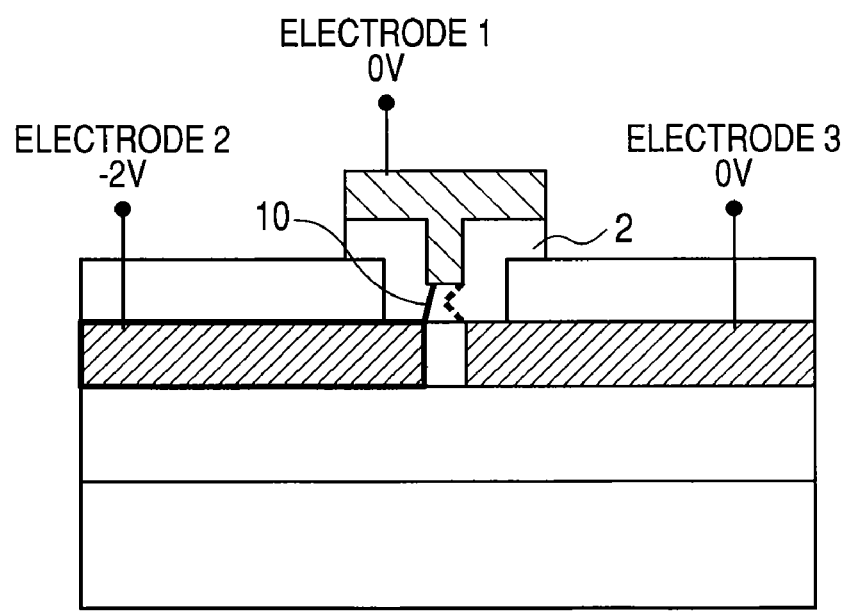
FIG. 6B is a fragmentary cross sectional view (along lines A-A of FIG. 1) showing the operation for switching the connections in the semiconductor device of the first embodiment of this invention.

The semiconductor device of the first embodiment sets to the state in FIG. 6A via the method in FIG. 4A, or namely sets to a state where a switch-on state is set between electrode 1 and electrode 3, and a switch-off state is set between electrode 1 and electrode 2. A voltage potential of −2 volts is applied to the electrode 2 and 0 volts is applied to the electrodes 1 and 3 in this state. The ionized copper electrons ($Cu^+$) then move in the solid electrolyte 2 from the electrode 1 to the electrode 2 to form a copper filament the same as in the operation in FIG. 4B. A conductive path 10 linking a Cu filament between electrode 1 and electrode 2 is then formed, setting a switch-on state between the electrode 1 and electrode 2. Simultaneously with setting this switch-on state, the copper atoms forming the filament in FIG. 6A are ionized due to −2 volts being applied and move in the solid electrolyte 2 towards the electrode 2. As this reaction progresses, the copper atoms forming the filament decrease in number and eventually cut off the conductive path. In other words, a switch-off state is set between the electrode 1 and electrode 3. Consequently in FIG. 6B a new type of switching operation not found in semiconductor devices of the related art is implemented for switching the conductive path 10 from the electrode 1-electrode 3, to the electrode 1-electrode 2, without applying a difference in voltage potential between electrode 1-electrode 3.

FIG. 7 through FIG. 10 are a plan view and cross sectional views showing one example of the method for producing the semiconductor device of the first embodiment.

Figure 7A:
FIG. 7A is a cross sectional view showing an example of the method for producing the semiconductor device 1 of the first embodiment.
Figure 7B:
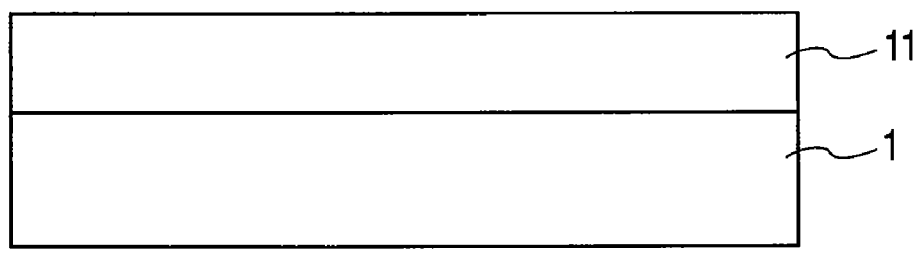
FIG. 7B is a cross sectional view showing an example of the method for producing the semiconductor device 1 of the first embodiment.
Figure 7C:
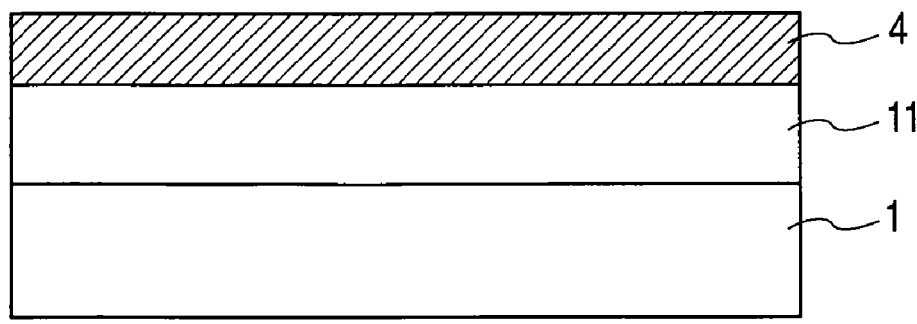
FIG. 7C is a cross sectional view showing an example of the method for producing the semiconductor device 1 of the first embodiment.
Figure 8A:
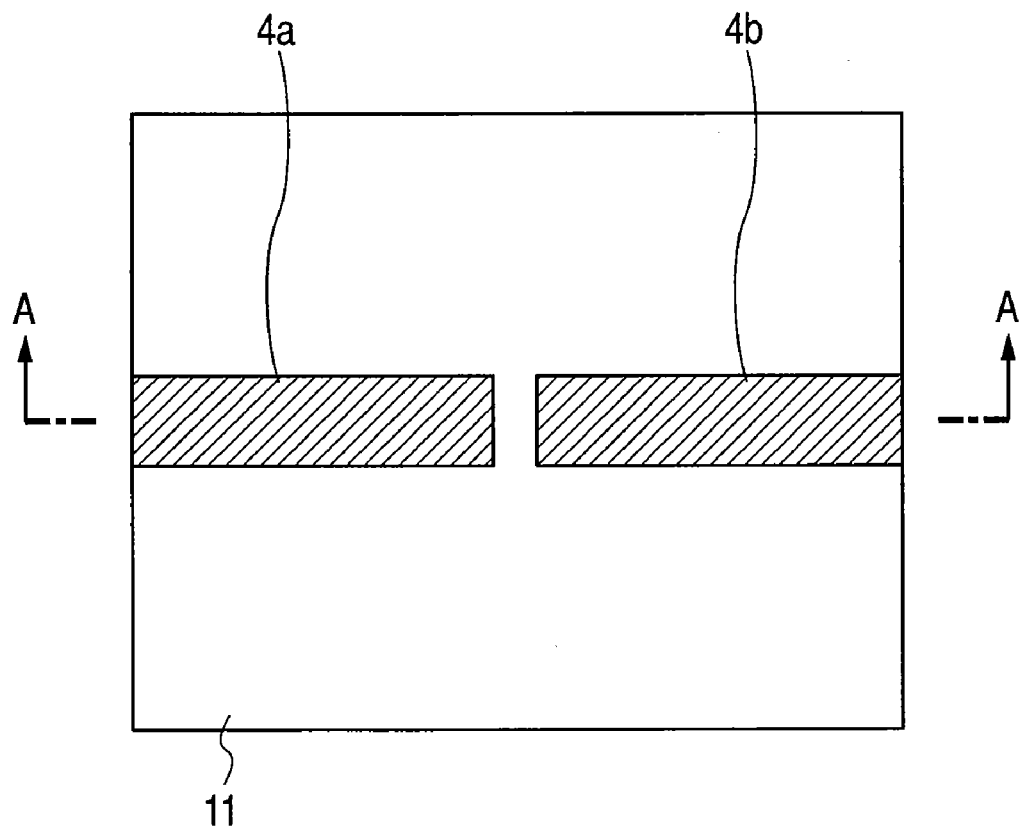
FIG. 8A is a flat view showing an example of the method for producing the semiconductor device 1 of the first embodiment.
Figure 8B:
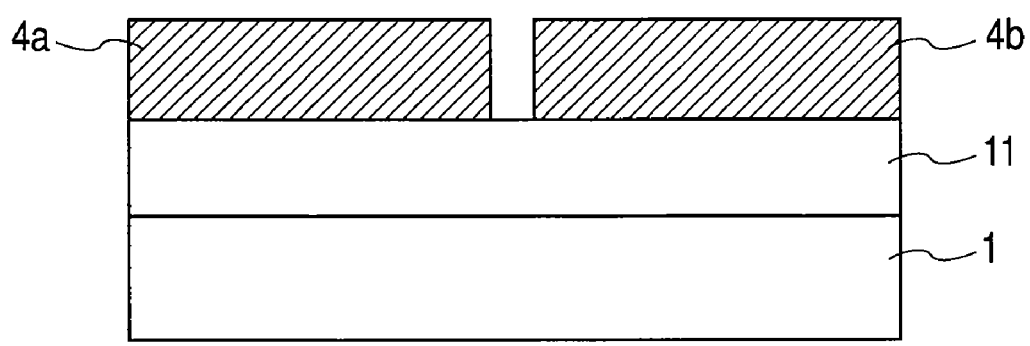
FIG. 8B is a flat view showing an example of the method for producing the semiconductor device 1 of the first embodiment.

A semiconductor substrate 1 is first of all prepared (FIG. 7A). An insulator film 11 is then deposited to approximately 200 nm using for example the chemical vapor deposition (CVD) method (FIG. 7B). A tungsten film 4 for example is next deposited to approximately 100 nm by the CVD method (FIG. 7C). The tungsten film 4 is next patterned on 4a and 4b by lithography and dry etching techniques. A flat view of the patterning shapes is shown in FIG. 8A. A cross sectional view is shown in FIG. 8B taken along lines A-A in FIG. 8A.

Figure 9A:
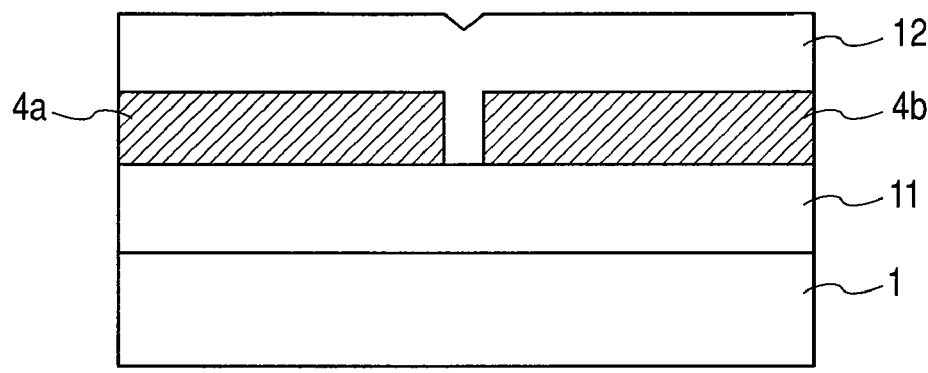
FIG. 9A is a cross sectional view showing an example of the method for producing the semiconductor device 1 of the first embodiment.

A silicon oxide film 12 is next deposited by the CVD method (FIG. 9A). The space on the tungsten film 4 that was patterned in FIGS. 8A and 8B is completely buried by the silicon oxide film 12 at this time.

Figure 9B:
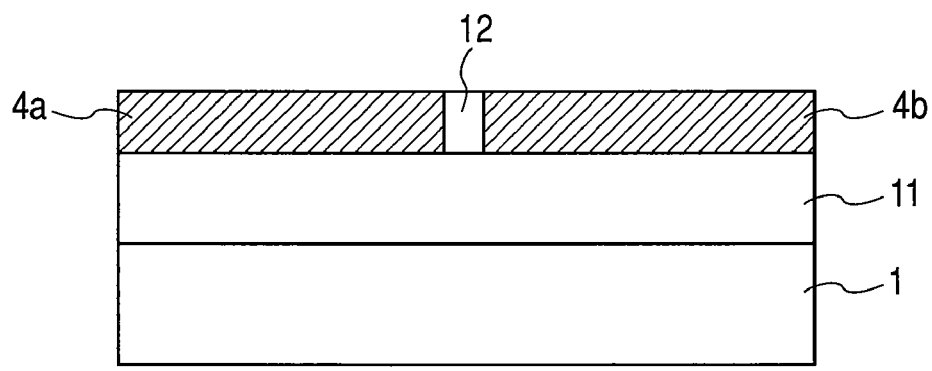
FIG. 9B is a cross sectional view showing an example of the method for producing the semiconductor device 1 of the first embodiment.
Figure 9C:
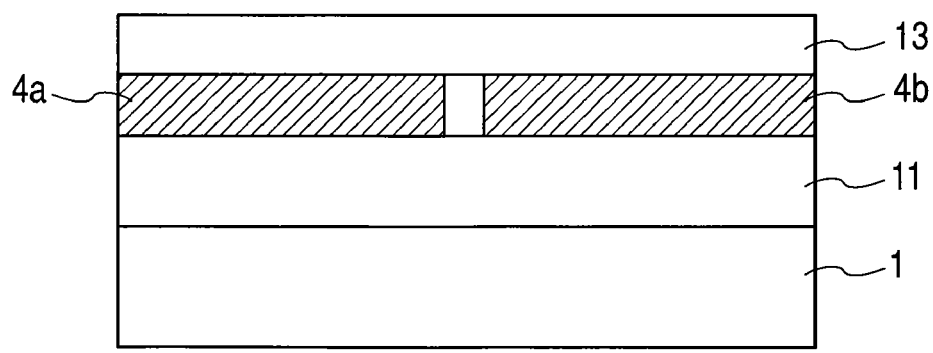
FIG. 9C is a cross sectional view showing an example of the method for producing the semiconductor device 1 of the first embodiment.

A portion of the silicon oxide film 12 is then stripped away by using the chemical mechanical polishing (CMP) method, to expose the upper surface of the tungsten film 4a, 4b (FIG. 9B). The silicon oxide film 13 is then deposited to approximately 100 nm (FIG. 9C).

Figure 10A:
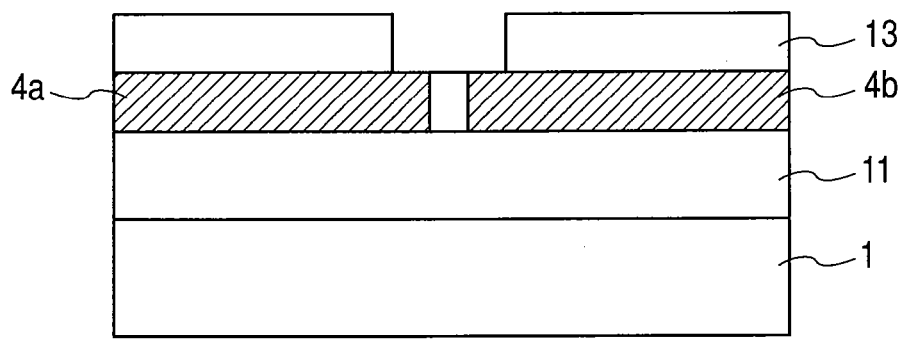
FIG. 10A is a cross sectional view showing an example of the method for producing the semiconductor device 1 of the first embodiment.

The silicon oxide film 13 is then patterned by dry etching and lithography techniques to form a space. A portion of the upper surface of the tungsten films 4a, 4b are exposed at this time (FIG. 10A).

Figure 10B:
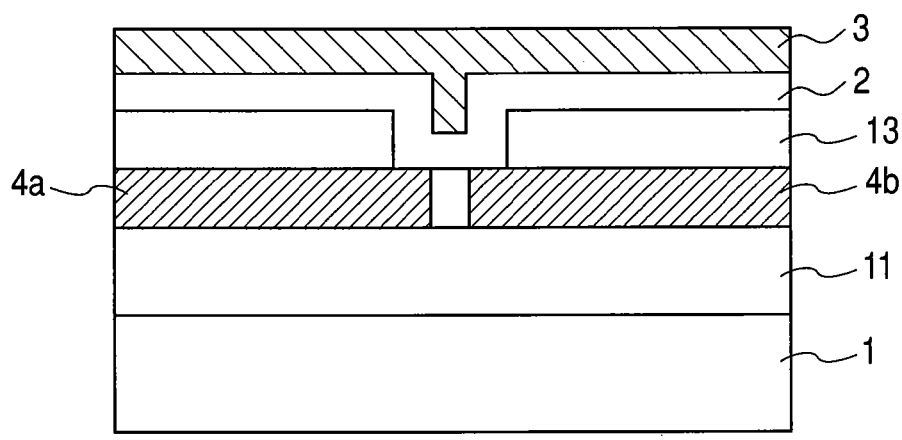
FIG. 10B is a cross sectional view showing an example of the method for producing the semiconductor device 1 of the first embodiment.

The solid electrolyte 2 and the Copper electrode 3 are then deposited by the sputter method or the CVD method (FIG. 10B). Here, films such as $CuS_2$, CuTaO, CuTaS can be utilized as the solid electrolyte 2.

Figure 10C:
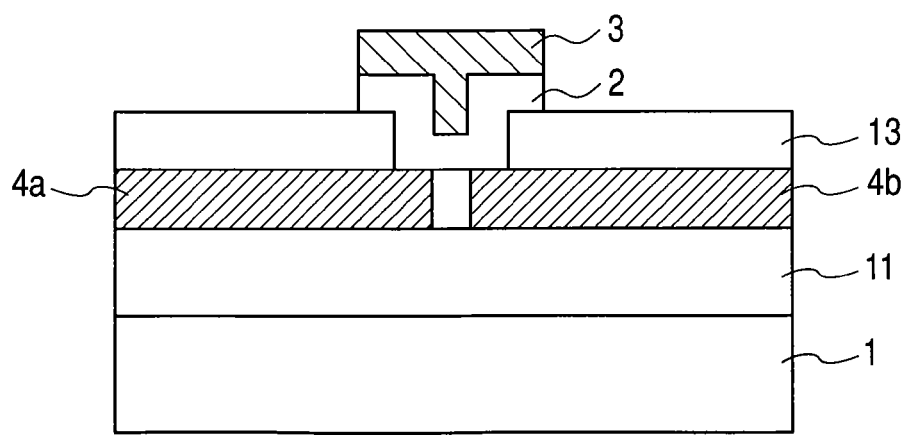
FIG. 10C is a cross sectional view showing an example of the method for producing the semiconductor device 1 of the first embodiment.

The solid electrolyte 2 and the Copper electrode 3 are next patterned by lithography and dry etching techniques (FIG. 10C).

Though not shown in the drawing, after forming the inter-poly dielectric film, a contact hole 4 extending to the tungsten electrodes 4a, 4b, and contact holes are then formed for the integrated circuits formed on the semiconductor substrate 1. A metallic film is next deposited and the wiring patterned to complete the semiconductor device.

The semiconductor device of this embodiment is a nonvolatile switch also possessing a simple structure and small surface area. Compared to the volatile switch of the related art with its large surface area using CMOS, the semiconductor device of this invention is superior in terms of production costs and functions.

Second Embodiment

In the first embodiment, the solid electrolyte was formed as a single layer and formed from the copper element which is easily diffusible into one electrode (electrode 3). However, the solid electrolyte may be formed in two layers, and one layer may contain a high concentration of an easily diffusible element, and moreover need not utilize a pure copper electrode.

Figure 11:
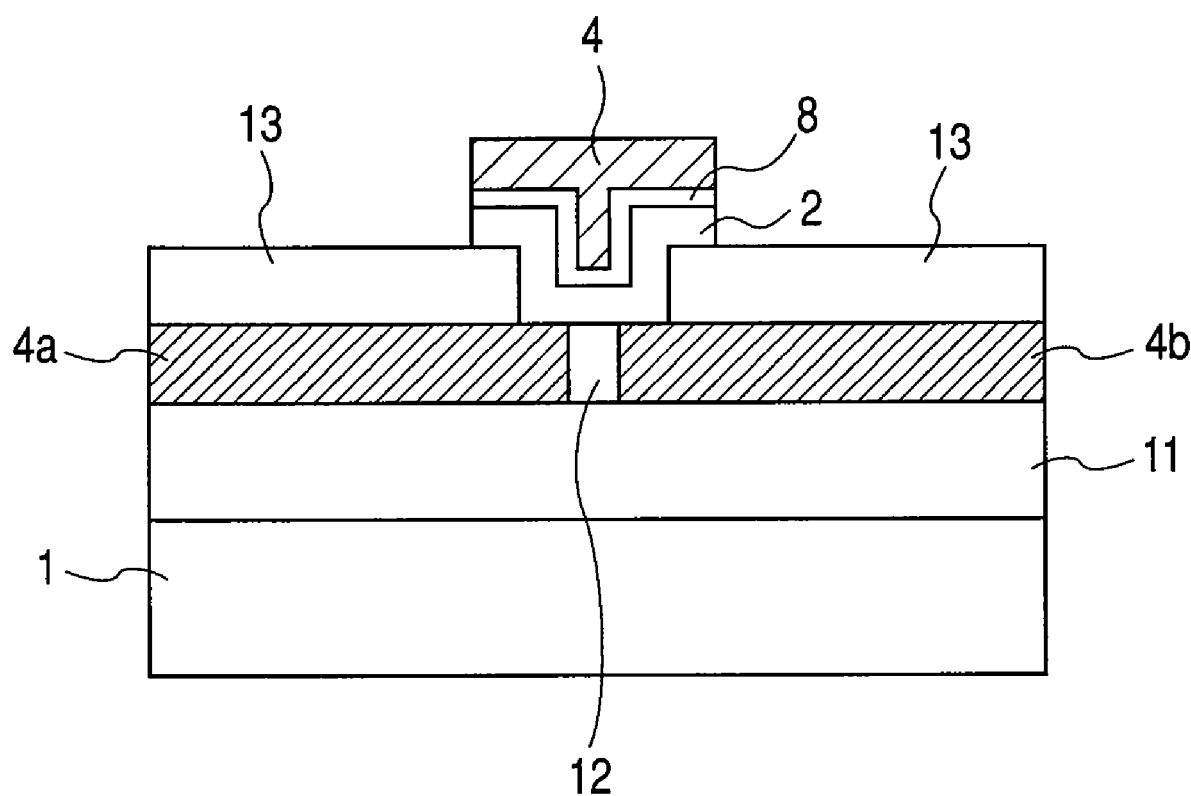
FIG. 11 is a fragmentary cross sectional view (along lines A-A of FIG. 1) showing an example of the semiconductor device of the second embodiment of this invention.

FIG. 11 is a cross sectional view taken along lines A-A shown in the example in FIG. 1, for the semiconductor integrated circuit device serving as the second embodiment of this invention.

Here, the same as in the first embodiment, by applying a voltage to the electrode 5, a copper filament can be formed on the solid electrolyte 2 with copper (Cu) supplied from a solid electrolyte (film) 8 containing a high concentration of copper; and the copper filament can be eliminated by returning the copper in the copper filament generated by the solid electrolyte 2 to the solid electrolyte 8. This solid electrolyte 8 possesses low resistance and contains many copper atoms so may be considered virtually as part of the electrode. The switch-on/switch-off states can be set by generating or eliminating the copper filament in the solid electrolyte 2. This embodiment implements the same operation as the semiconductor device 1 of the first embodiment by applying voltages the same as in FIG. 4 through FIG. 6.

Here, the combination of solid electrolyte 2 and solid electrolyte 8 may for example be: solid electrolyte 2/solid electrolyte 8 equals CuTaO/CuTaS, CuTaO/CuS, $WO_3$/CuTaS, $WO_3$/CuS, $Ta_2O_5$/CuTaS, $Ta_2O_5$/CuS etc. Moreover, silver (Ag) may be used instead of copper such that for example $Ta_2O_5$/$Ag_2S$ may serve as the metallic atoms forming the filament making up the conductive path in the solid electrolyte.

The semiconductor device of this second embodiment is formed by one example of the method shown in FIG. 7 through FIG. 10 for producing the semiconductor device of the first embodiment but can be manufactured by changing the solid electrolyte 2 to stacked layers of solid electrolyte 2 and solid electrolyte 8, and also changing the copper electrode 3 to the tungsten film 4.

The semiconductor device of this embodiment is a nonvolatile switch also possessing small surface area due to a simple structure. Compared to the volatile switch of the related art with its large surface area using CMOS, the semiconductor device of this invention is superior both in terms of production costs and functions.

Third Embodiment

Figure 12A:
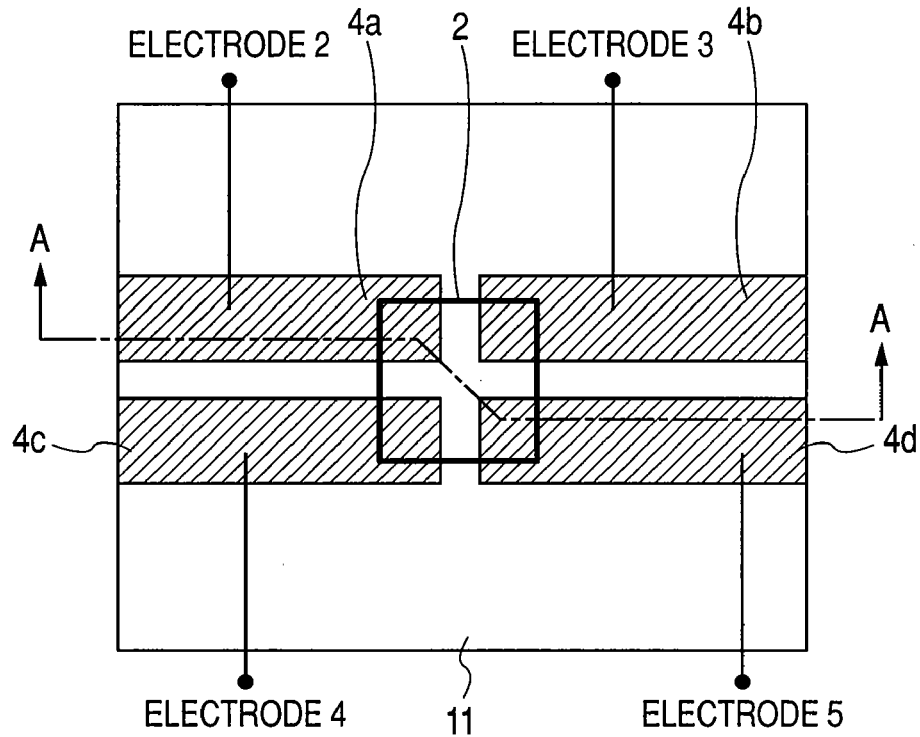
FIG. 12A is a fragmentary cross sectional view (along lines A-A of FIG. 1) showing an example of the semiconductor device of the third embodiment of this invention.
Figure 12B:
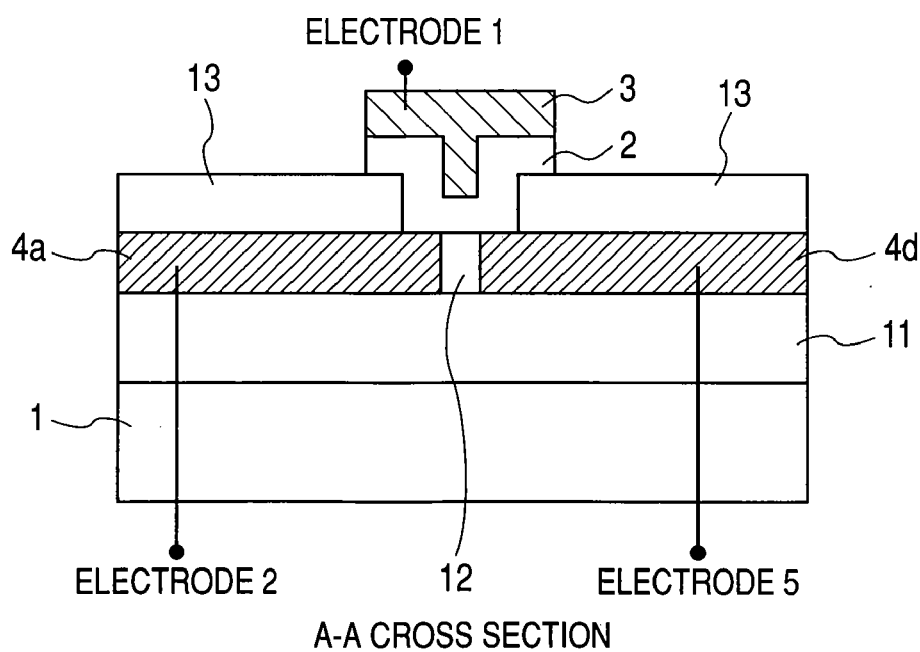
FIG. 12B is a cross sectional view taken along lines A-A of FIG. 12A is a fragmentary flat view showing one example of the semiconductor device of the third embodiment of this invention.

The examples in the first and second embodiment contained three electrodes but the number of electrodes can be further increased. FIG. 12A is a flat view showing a portion of the one example of the semiconductor integrated circuit device of the third embodiment of this invention. FIG. 12B is a cross sectional view taken along lines A-A of FIG. 12A.

The same as in the first embodiment, in a state where there is no conductive path generated in the solid electrolyte 2, or in other words where all the switch electrodes are in a switch-off state, and approximately −2 volt of the voltage is applied for example to the electrode 2, and 0 volts is applied to the electrodes 1, 3, 4, 5, then a conductive path is generated between the electrode 1 and the electrode 2, setting a switch-on state. The generated conductive path can be cut off or eliminated setting a switch-off state by setting the electrode 2 to +2 volts, and the electrodes 1, 3, 4, 5 to 0 volts. Also in a state where a conductive path was generated between the electrode 1 and the electrode 2, and no other conductive paths were generated, applying −2 volts for example to the electrode 3, and 0 volts to the electrodes 1, 2, 4, 5, eliminates the conductive path generated between the electrode 1 and electrode 2 by way of the electrical field from the −2 volts applied to the electrode 3, and instead generates a conductive path between the electrode 1 and the electrode 3. Consequently, rather than applying a voltage differential between the electrode 1-electrode 2, an operation is performed that switches the conductive path from the electrode 1-electrode 2, to the electrode 1-electrode 3. This type of conductive path switching can be mutually performed among all electrodes of electrode 1-electrode 2, electrode 1-electrode 3, electrode 1-electrode 4, and electrode 1-electrode 5.

The number of electrodes were utilized in the first and second embodiments was three, and the number of electrodes utilized in the third embodiment was five, however the number of electrodes can of course be increased even further.

Combinations of the solid electrolyte 2, the solid electrolyte 8, and the tungsten film 4 can be utilized, instead of the combination of solid electrolyte 2 and copper electrode, the same as the second embodiment. The combination of the solid electrolyte 2 and the solid electrolyte 8 may also be the same as in the second embodiment.

The semiconductor device of this embodiment is a nonvolatile switch also possessing a simple structure and small surface area. Compared to the volatile switch of the related art with its large surface area using CMOS, the semiconductor device of this invention is superior both in terms of production costs and functions.

Fourth Embodiment

The first, second and third embodiments utilized the space in the insulator film 13, so that the electrodes were in mutual proximity to each other by way of the solid electrolyte within a narrow electrode range, however ultra-small processing techniques may be utilized on the solid electrolyte and electrode on the upper side.

Figure 13:
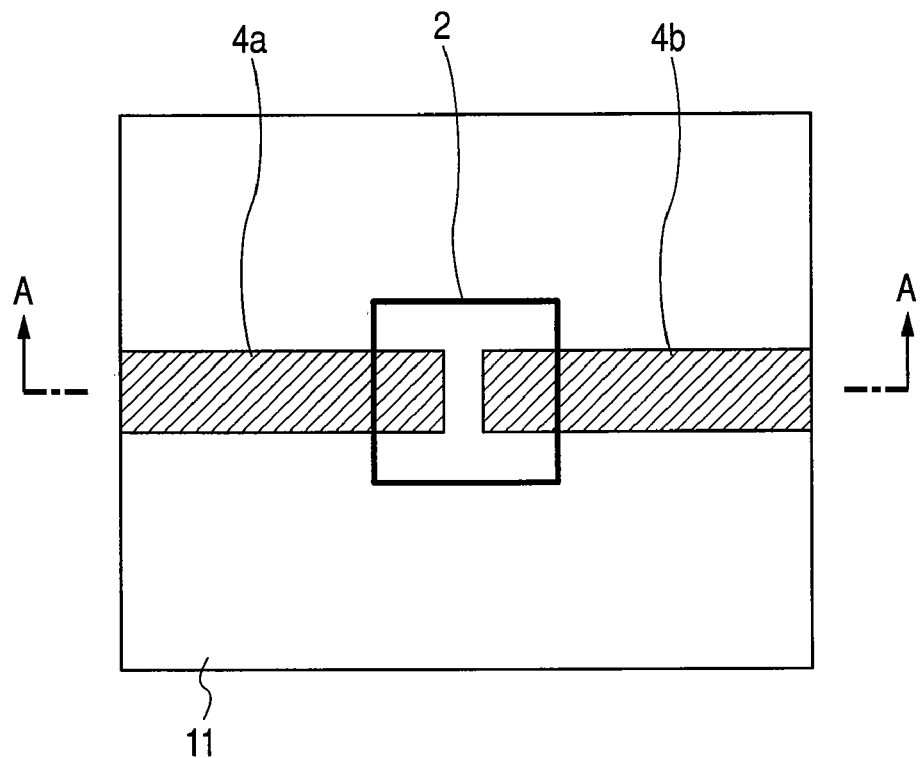
FIG. 13 is a fragmentary flat view showing an example of the semiconductor device of the fourth embodiment of this invention.
Figure 14:
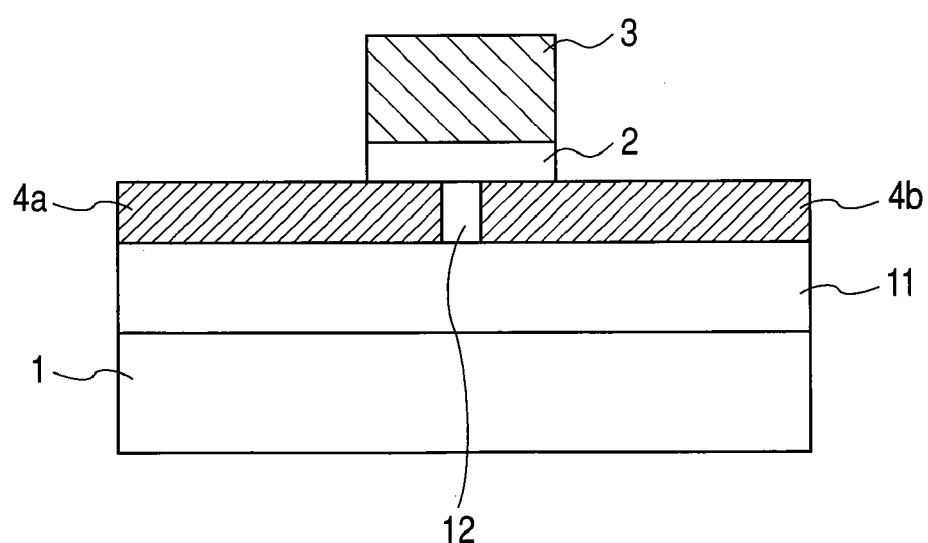
FIG. 14 is a fragmentary cross sectional view showing an example of the semiconductor device of the fourth embodiment of this invention, and is a view taken along the lines A-A in FIG. 13.

FIG. 13 is a fragmentary flat view showing an example of the semiconductor device of the fourth embodiment of this invention. FIG. 14 is a cross sectional view taken along lines A-A of FIG. 13. In the flat view in FIG. 13, a portion of the structural members are omitted to make the drawing easier to view.

The semiconductor device of the fourth embodiment contains two tungsten electrodes (electrode 4a and 4b) on the lower side of the solid electrolytes 2, 8, and one electrode (electrode 104) on the upper side the same as in the second embodiment. The operating principle is the same as the second embodiment, and the operating voltages are also the same.

Figure 15:
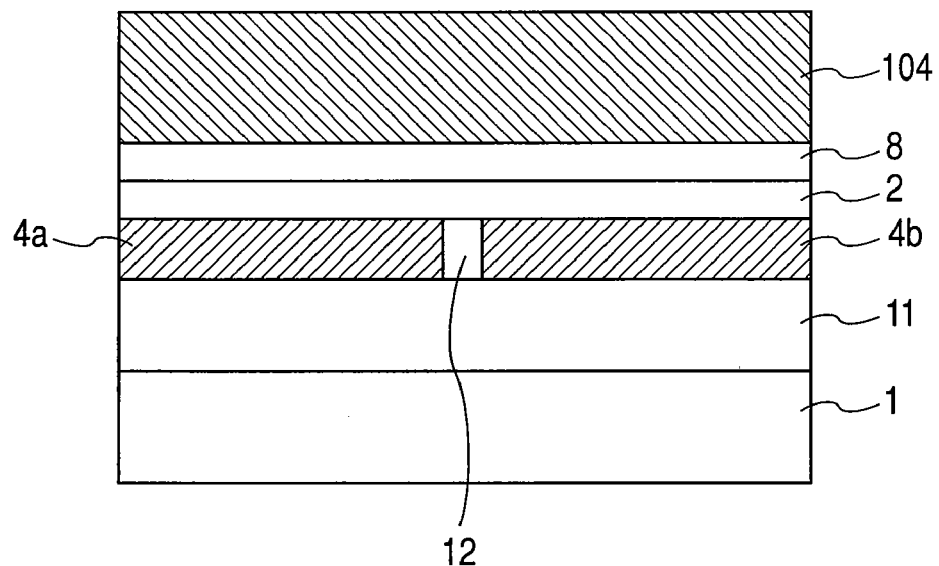
FIG. 15 is a fragmentary cross sectional view showing one example of the method for producing the semiconductor device of the fourth embodiment.

The method for producing the semiconductor device of the fourth embodiment is described next. After the steps in FIG. 9A of the first embodiment, a solid electrolyte 2, and a solid electrolyte 8 with low resistance and containing a higher concentration of copper (Cu) than the solid electrolyte 2 and the tungsten film 104 are deposited on the silicon oxide film 12 (FIG. 15). Patterning is then performed in the sequence of tungsten film 104, solid electrolyte 8, and solid electrolyte 2 by using lithography and dry etching techniques.

Though not shown in the figure, contact holes extending to the tungsten electrodes 4a, 4b and the tungsten film 104, as well as contact holes for the integrated circuit are formed on the semiconductor substrate 1 after forming the interpoly dielectric film. A metallic film is next deposited and a wiring patterned, to complete the semiconductor device.

The semiconductor device of this embodiment is a nonvolatile switch also possessing a small surface area due to a simple structure. Compared to the volatile switch of the related art with its large surface area using CMOS, the semiconductor device of this invention is superior both in terms of production costs and functions.

Fifth Embodiment

Figure 16:
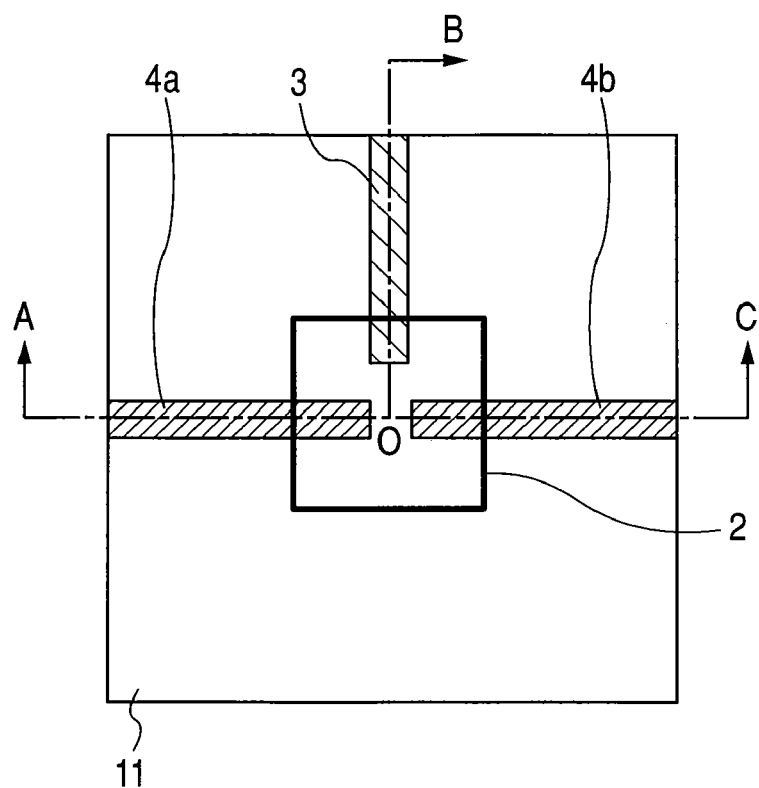
FIG. 16 is a fragmentary flat view showing one example of the method for producing the semiconductor device of the fifth embodiment.
Figure 17A:
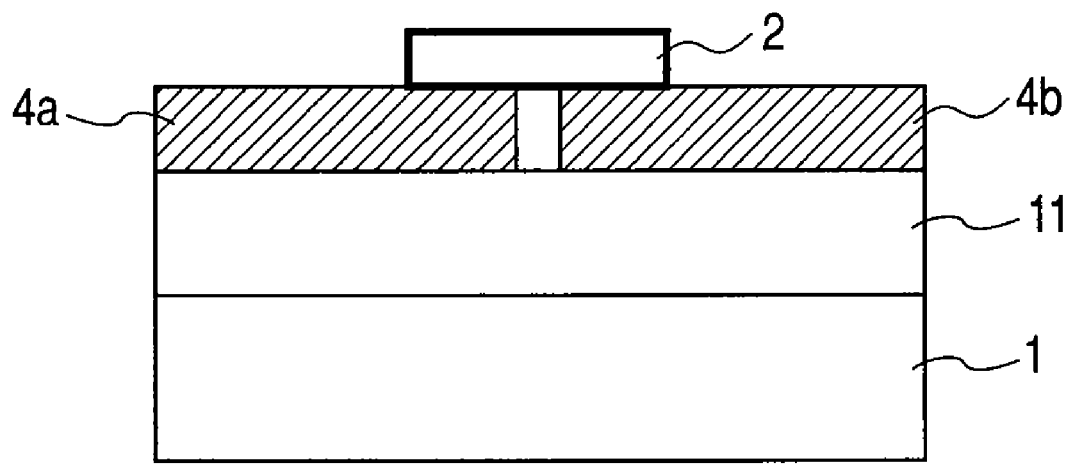
FIG. 17A is a fragmentary cross sectional view showing one example of the semiconductor device of the fifth embodiment of this invention (cross section along lines A-O-C of FIG. 16)
Figure 17B:
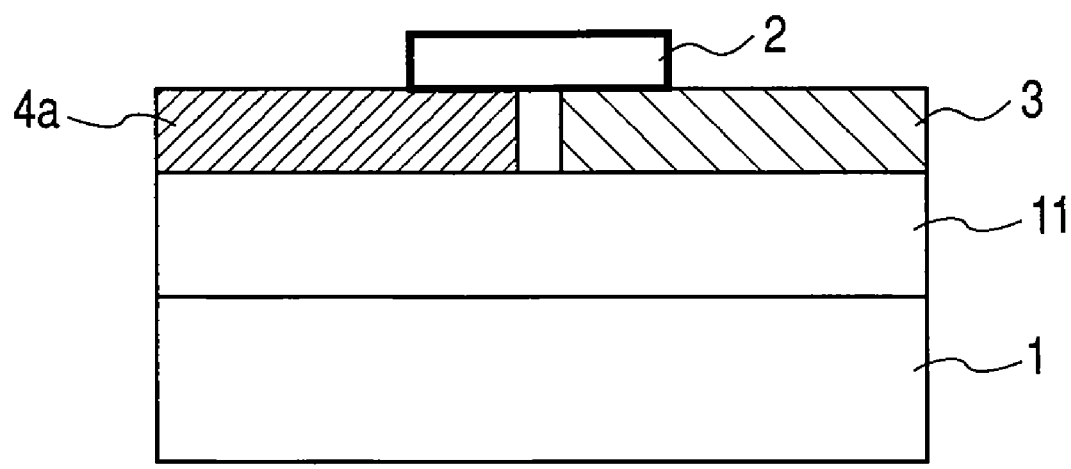
FIG. 17B is a fragmentary cross sectional view showing one example of the semiconductor device of the fifth embodiment of this invention (cross section along lines A-O-B of FIG. 16)

FIG. 16 is a fragmentary flat view showing an example of the semiconductor device of the fifth embodiment of this invention. FIG. 17A and FIG. 17B are respectively a cross sectional view taken along lines A-O-C and along lines A-O-B of FIG. 16. In the flat view in FIG. 16, a portion of the structural members are omitted to make the drawing easier to view. In the semiconductor device of this embodiment, the switching device utilizes a phenomenon the same as the first, second, and third embodiments for setting a switch-on state by forming a conductive path of tiny metallic ions such as copper within a high-resistance solid electrolyte material, and a switch-off state formed by eliminating the conductive path that was generated. The conductive path is generated or eliminated by applying a voltage across the electrodes to move the metallic ions such as copper (Cu) within the solid electrolyte.

The semiconductor device of the fifth embodiment includes an insulator film 11, tungsten electrodes 4a, 4b buried within the trench formed in the insulator film 11, and a copper electrode 3 buried within the trench formed in the same insulator film 11, and a solid electrolyte 2 covering the section near the electrodes 4a, 4b, and 3.

Figure 18:
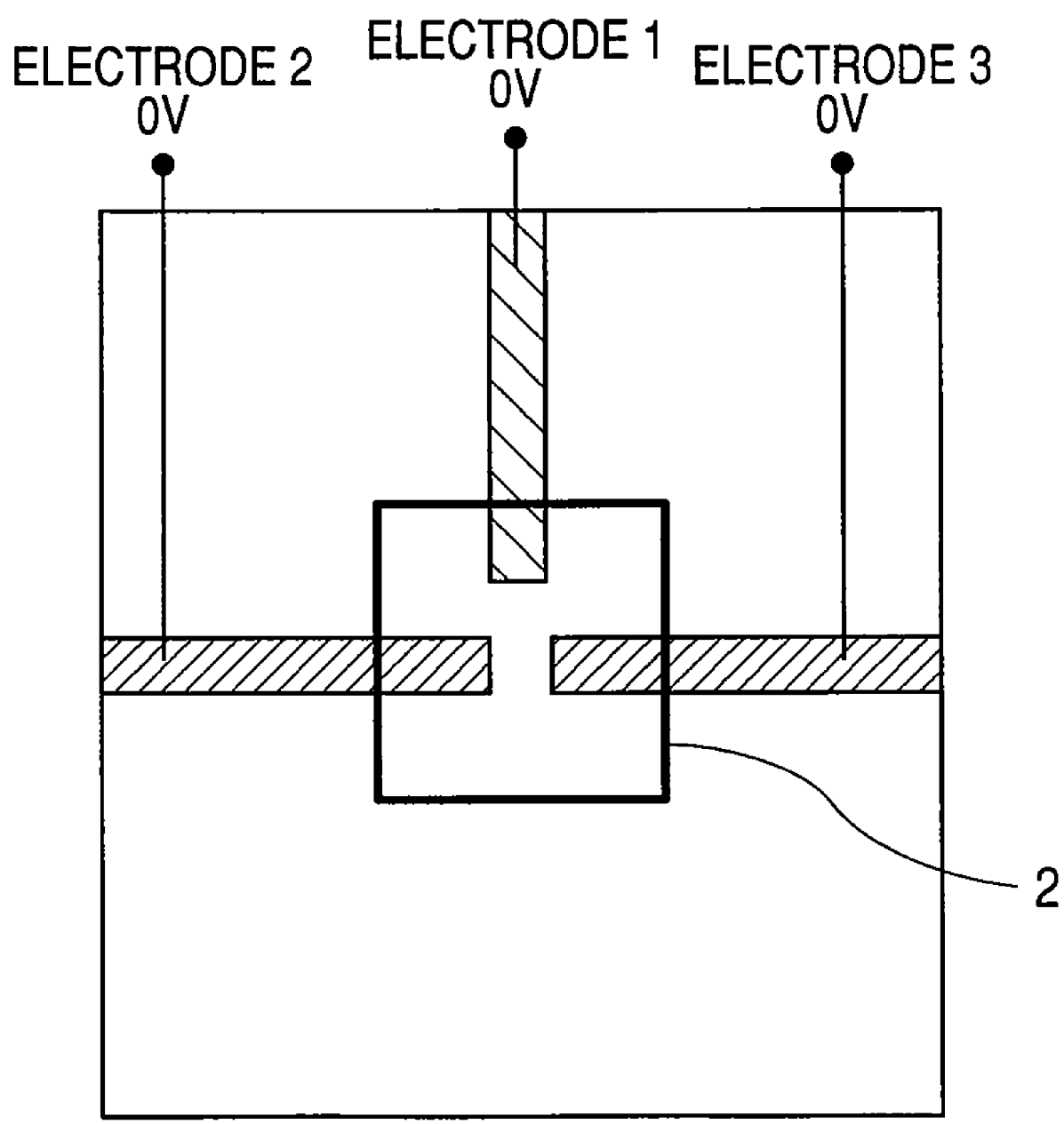
FIG. 18 is a fragmentary flat view showing the switch-off state of the semiconductor device of the fifth embodiment of this invention.

The three electrodes are specified as electrode 1, 2, 3 as shown in FIG. 18. In the state in FIG. 18, the three electrodes are all at zero volts, and no conductive path is formed of metal (Cu) in the solid electrolyte 2.

In the semiconductor device of this embodiment, the switch-on/switch-off operation can be performed by applying a voltage to the electrode 1, 2, 3 to generate or eliminate a conductive path in the solid electrolyte 2 the same as described for the first embodiment in FIG. 4, FIG. 5, and FIG. 6. The switch-on and switch-off states are both nonvolatile the same as in the first embodiment and maintained in that state even if the voltage to the electrodes is stopped.

FIG. 19 through FIG. 24 are a cross sectional view and flat views showing an example of the method for producing the semiconductor device of the fifth embodiment.

Figure 19A:
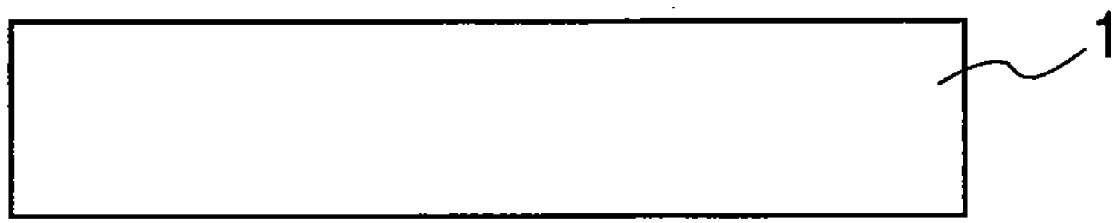
FIG. 19A is a fragmentary cross sectional view showing one example of the method for producing the semiconductor device of the fifth embodiment.
Figure 19B:
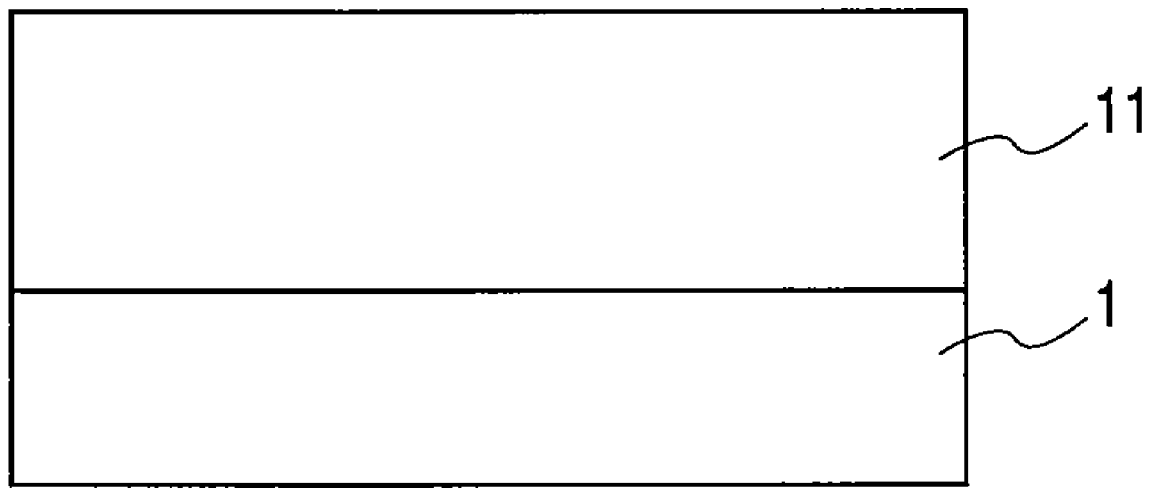
FIG. 19B is a fragmentary cross sectional view showing one example of the method for producing the semiconductor device of the fifth embodiment.
Figure 20A:
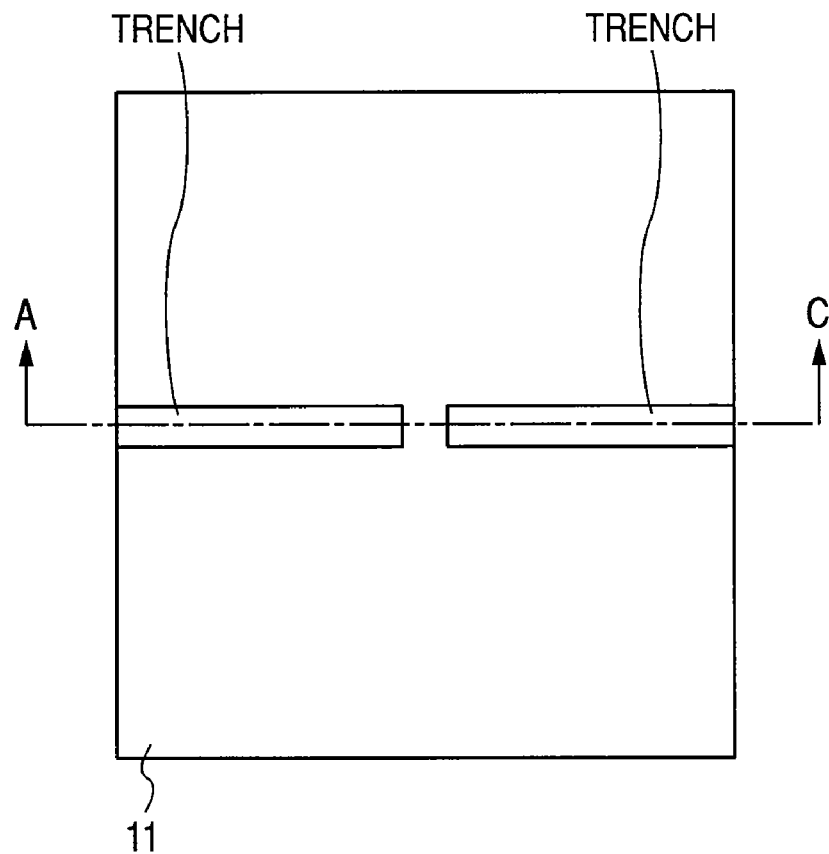
FIG. 20A is a flat view showing one example of the method for producing the semiconductor device of the fifth embodiment.
Figure 20B:
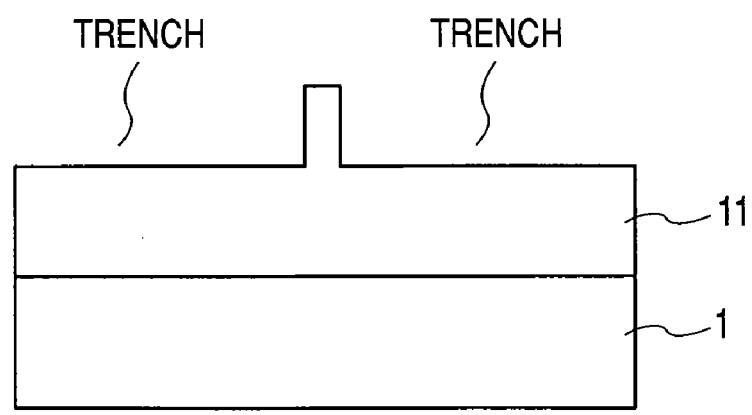
FIG. 20B is a cross sectional view taken along lines A-C of FIG. 20A.

A semiconductor substrate 1 is first of all prepared (FIG. 19A). An insulator film 11 is then deposited to approximately 200 nm using for example the chemical vapor deposition (CVD) method (FIG. 19B). Two trenches are next formed to a depth of approximately 100 nanometers in the insulator film 11 by lithography and dry etching techniques. These trenches become the spaces for forming the electrodes 4a, 4b in a latter process. A flat view of this state is shown in FIG. 20A. FIG. 20B is a cross sectional view taken along lines A-A of FIG. 20A.

Figure 21A:
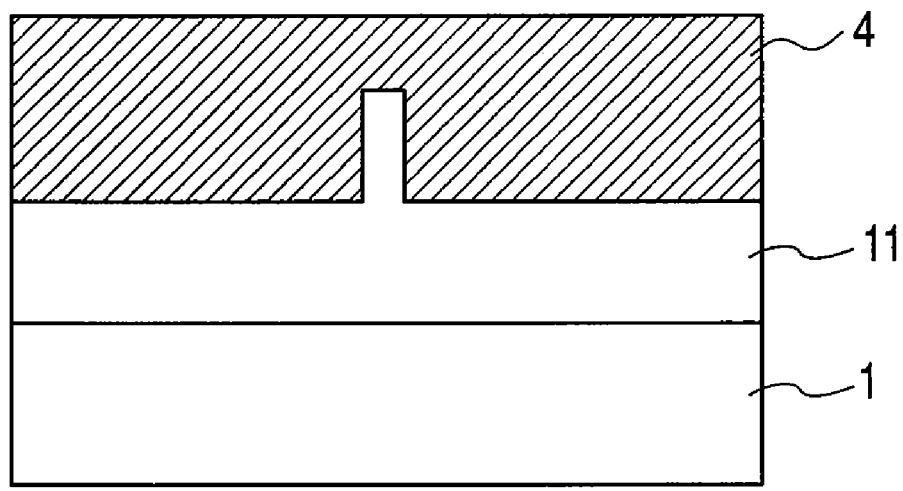
FIG. 21A is a fragmentary cross sectional view showing one example of the method for producing the semiconductor device of the fifth embodiment.

A tungsten film 4 is next deposited so as to completely fill the trenches (FIG. 21A). Diffusion of unneeded tungsten atoms into the insulator film 11 can be prevented by forming barrier metal on the trench surfaces at this time. A laminated film for example of Ti or TiN may be utilized as the barrier metal.

Figure 21B:
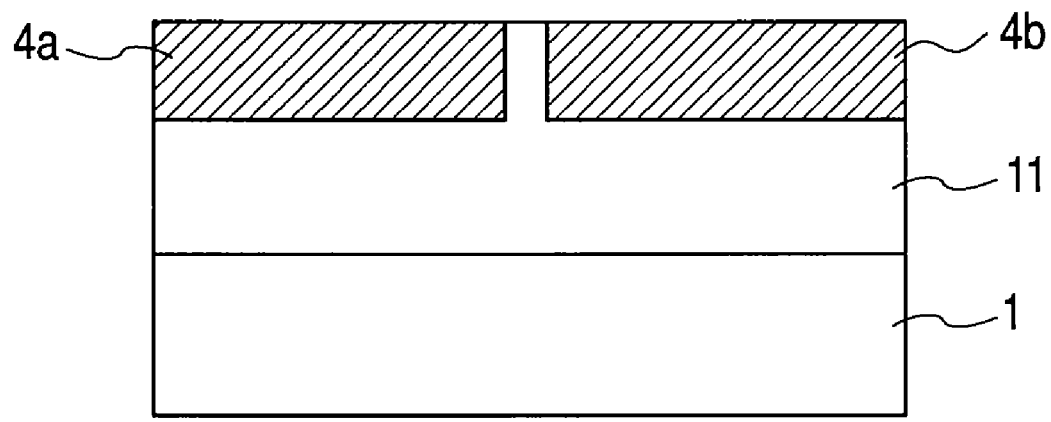
FIG. 21B is a fragmentary cross sectional view showing one example of the method for producing the semiconductor device of the fifth embodiment.

A portion of the tungsten film 4 is then stripped away by using the chemical mechanical polishing (CMP) method, to expose the upper surface of the silicon oxide film 11 (FIG. 21B). Exposing the upper surface of the silicon oxide film 11, leaves the tungsten 4a, 4b embedded in the two trenches formed in FIG. 20A and FIG. 20B however the electrodes 4a and 4b are completely separated by the silicon oxide film 11.

Figure 22A:
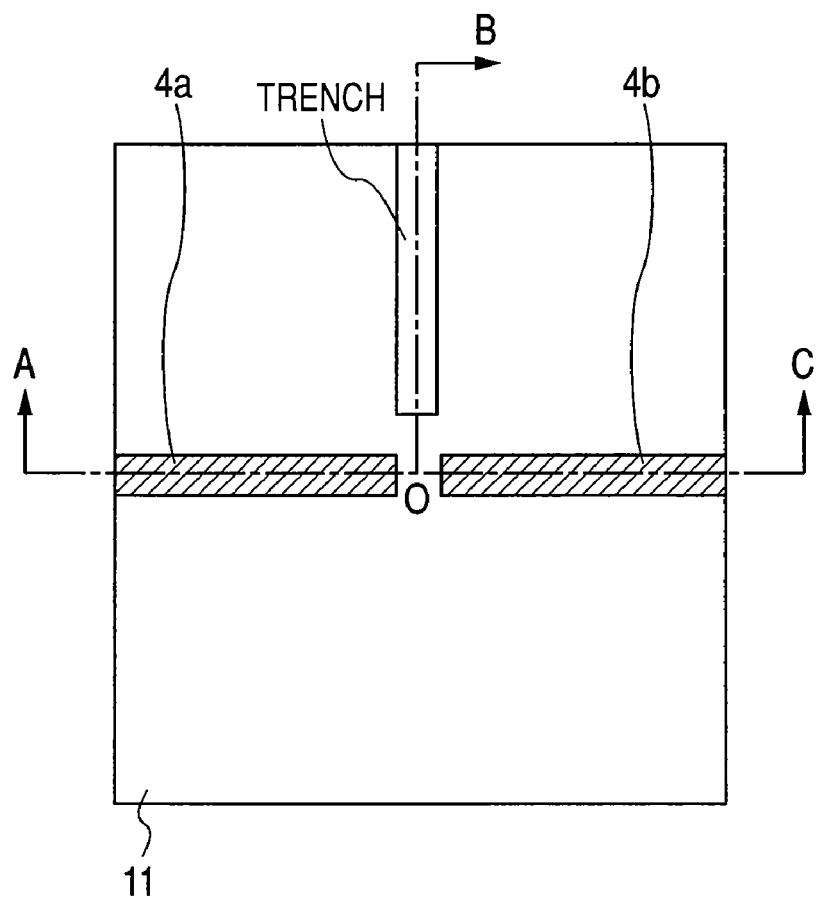
FIG. 22A is a flat view showing one example of the method for producing the semiconductor device of the fifth embodiment.
Figure 22B:
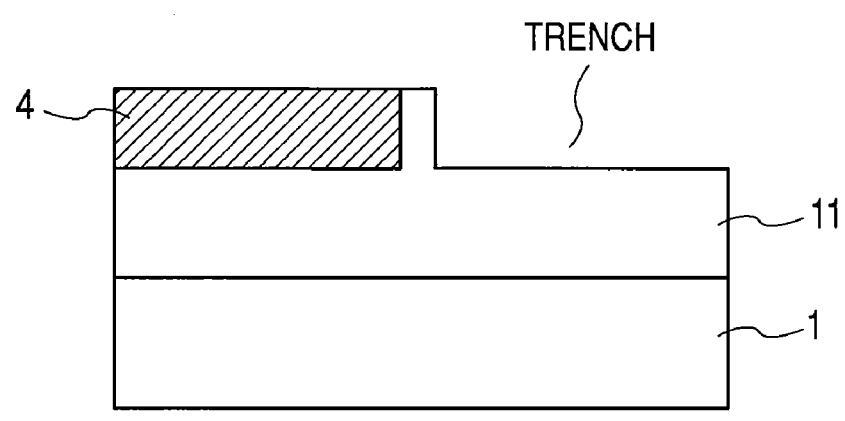
FIG. 22B is a fragmentary cross sectional view showing one example of the method for producing the semiconductor device of the fifth embodiment, and is taken along lines A-O-B of FIG. 22A.
Figure 23A:
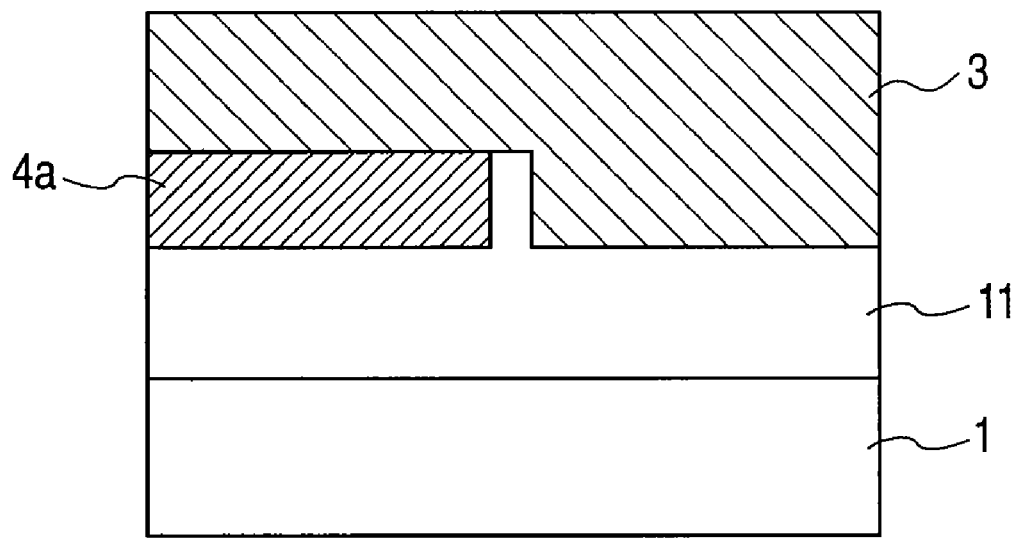
FIG. 23A is a fragmentary cross sectional view showing one example of the method for producing the semiconductor device of the fifth embodiment.
Figure 23B:
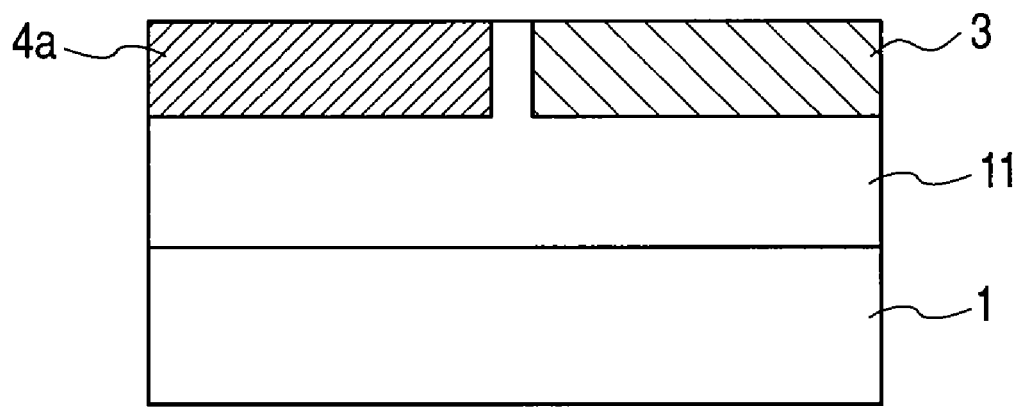
FIG. 23B is a fragmentary cross sectional view showing one example of the method for producing the semiconductor device of the fifth embodiment.

One trench is formed to a depth of approximately 100 nm within the insulator film 11 by lithography and dry etching techniques. This trench becomes a space formed for the copper electrode 3 in a latter process. FIG. 22A is a flat view of this state. FIG. 22B is a cross sectional view taken along lines A-O-B of FIG. 22A. A copper electrode 3 is next deposited to completely fill the trench (FIG. 23A). Forming a barrier metal on the groove surface at this time will prevent diffusion of unneeded Cu atoms into the insulator film 11. A laminated film for example of Ta, TaN can be utilized as the barrier metal A portion of the copper electrode 3 is next removed by the CMP method to expose the upper surface of the tungsten electrodes 4a, 4b and the upper surface of the silicon oxide film 11 (FIG. 23B). Exposing the upper surface of the tungsten electrodes 4a, 4b, and the upper surface of the silicon oxide film 11 mutually separates the tungsten electrodes 4a, 4b, and the copper electrode 3 with the silicon oxide film 11.

Figure 24A:
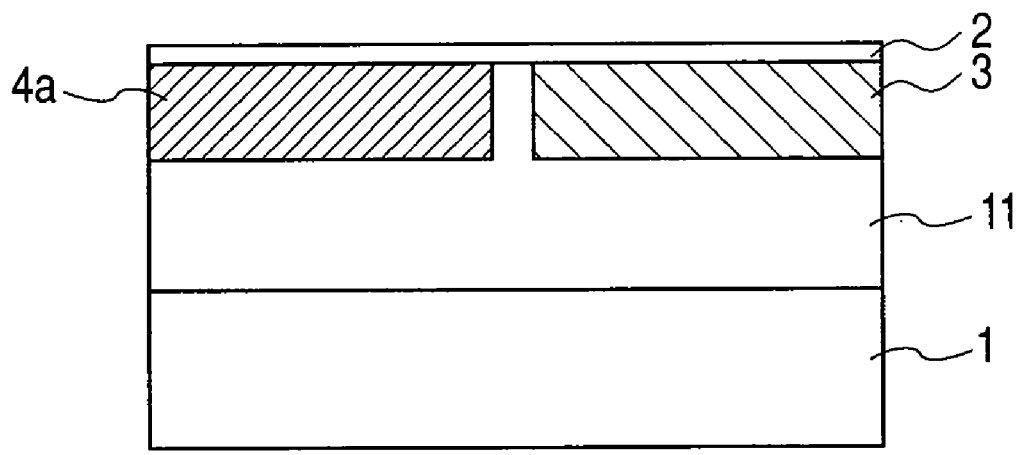
FIG. 24A is a fragmentary cross sectional view showing one example of the method for producing the semiconductor device of the fifth embodiment.
Figure 24B:
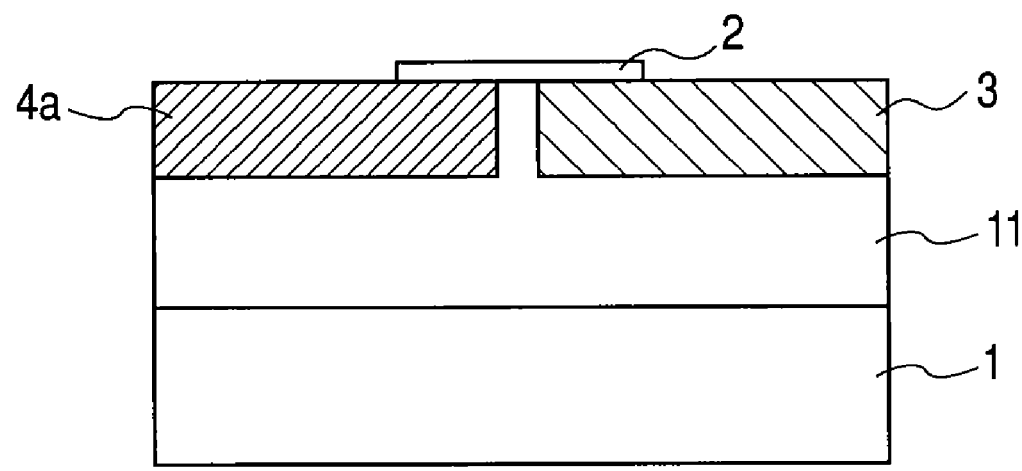
FIG. 24B is a fragmentary cross sectional view showing one example of the method for producing the semiconductor device of the fifth embodiment.

The solid electrolyte 2 is next deposited by the sputter method or CVD method (FIG. 24A). The solid electrolyte 2 is then patterned by lithography and dry etching techniques (FIG. 24B).

Though not shown in the figure, contact holes extending to the tungsten electrodes 4a, 4b and to the copper electrode 3 are formed, as well as contact holes for the integrated circuit on the semiconductor substrate 1 after forming the interpoly dielectric film. A metallic film is next deposited and a wiring patterned, to complete the semiconductor device.

The semiconductor device of this embodiment is a non-volatile switch also possessing a small surface area due to the simple structure. Compared to the volatile switch of the related art with its large surface area using CMOS, the semiconductor device of this invention is superior both in terms of production costs and functions.

Sixth Embodiment

Figure 25:
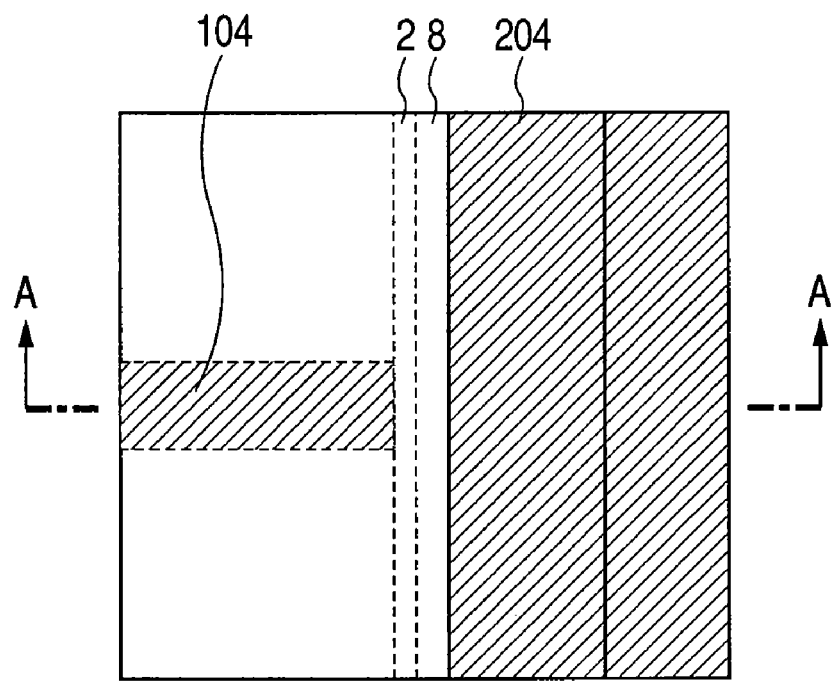
FIG. 25 is a fragmentary flat view showing one example of the semiconductor device of the sixth embodiment of this invention.
Figure 26:
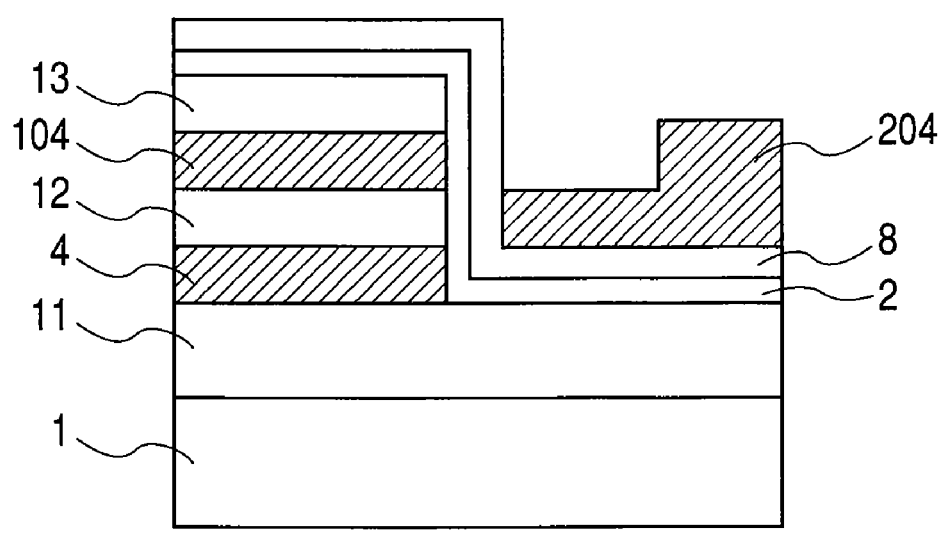
FIG. 26 is a fragmentary cross sectional view showing one example of the semiconductor device of the sixth embodiment of this invention, and is taken along the lines A-A of FIG. 25.

FIG. 25 is a fragmentary flat view showing an example of the semiconductor device of the sixth embodiment of this invention. FIG. 26 is cross sectional view taken along lines A-A of FIG. 25. In the flat view in FIG. 25, a portion of the structural members are omitted to make the drawing easier to view.

In the semiconductor device of this embodiment, the switching device utilizes a phenomenon the same as the first through fifth embodiments for setting a switch-on state by forming a conductive path of tiny metallic ions such as copper within a high-resistance solid electrolyte material, and a switch-off state formed by eliminating the conductive path that was generated. The conductive path is generated or eliminated by applying a voltage across the electrodes to move the metallic ions such as copper (Cu) within the solid electrolyte material.

Figure 27:
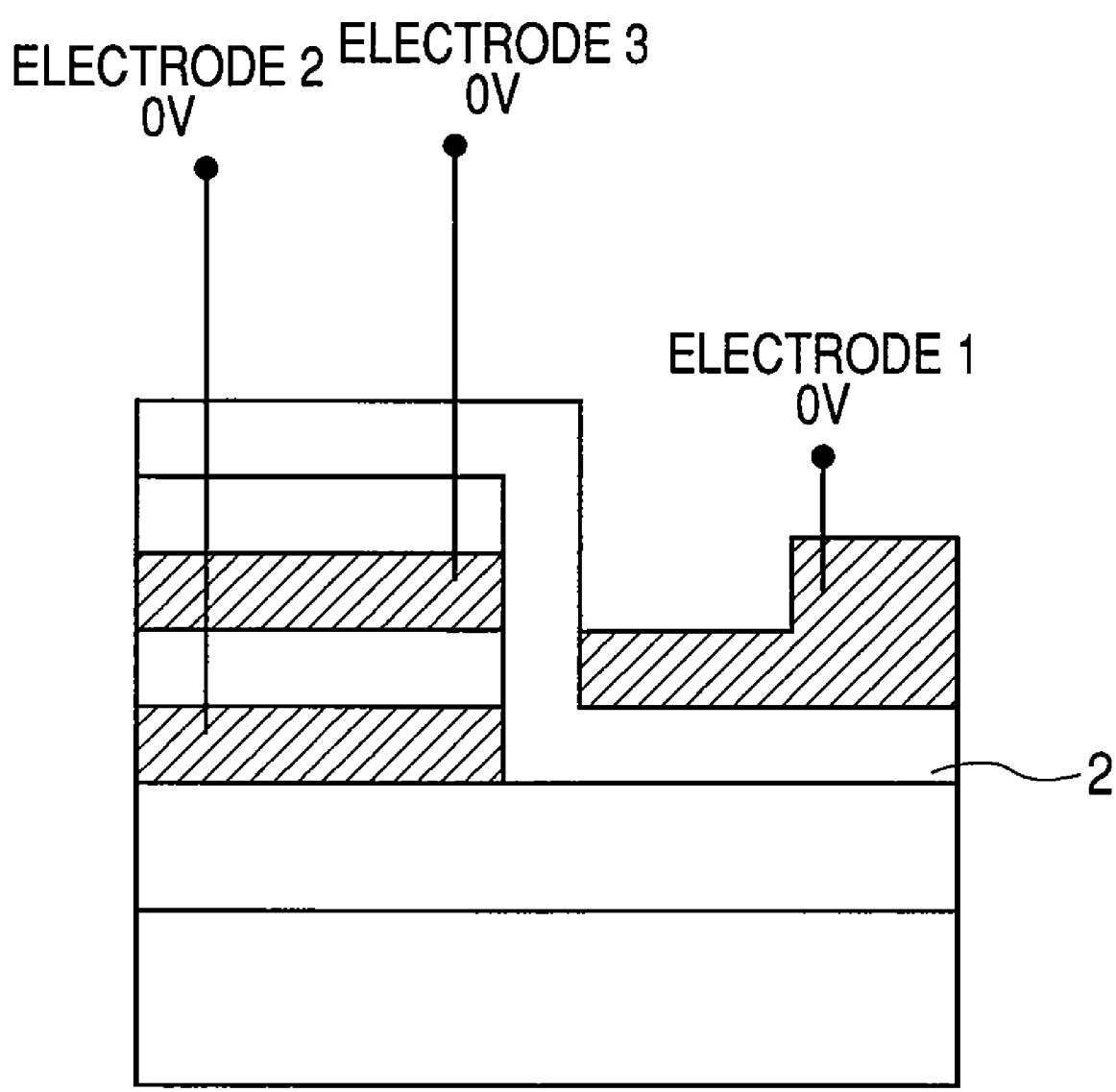
FIG. 27 is a fragmentary flat view showing the switch-on state of the semiconductor device of the sixth embodiment of this invention.

This switching device includes an insulator film 11, a tungsten electrode 4 deposited on the insulator film 11, an insulator film 12, a tungsten electrode 104, an insulator film 13, a low-resistance solid electrolyte 8 containing copper in a higher concentration than the solid electrolyte 2 and solid electrolyte 8, and a tungsten electrode 204 opposite the above two tungsten electrodes via the solid electrolytes 2, 8. The three electrodes are specified as electrodes 1, 2, 3 in FIG. 27. In FIG. 27 the three electrodes are all zero volts and there is no conductive path of metal (copper) generated in the solid electrolyte 2.

In the semiconductor device of this embodiment, the switch-on/switch-off operation can be performed by applying a voltage to the electrode 1, 2, 3 to generate or eliminate a conductive path in the solid electrolyte 2 the same as described in the second embodiment. The switch-on and switch-off states are both non volatile, the same as the second embodiment and maintained in that state even if the voltage to the electrodes is stopped.

FIG. 28 through FIG. 35 are cross sectional views and flat views showing an example of the method for producing the semiconductor device of the sixth embodiment.

Figure 28A:
FIG. 28A is a fragmentary cross sectional view showing one example of the method for producing the semiconductor device of the sixth embodiment.
Figure 28B:
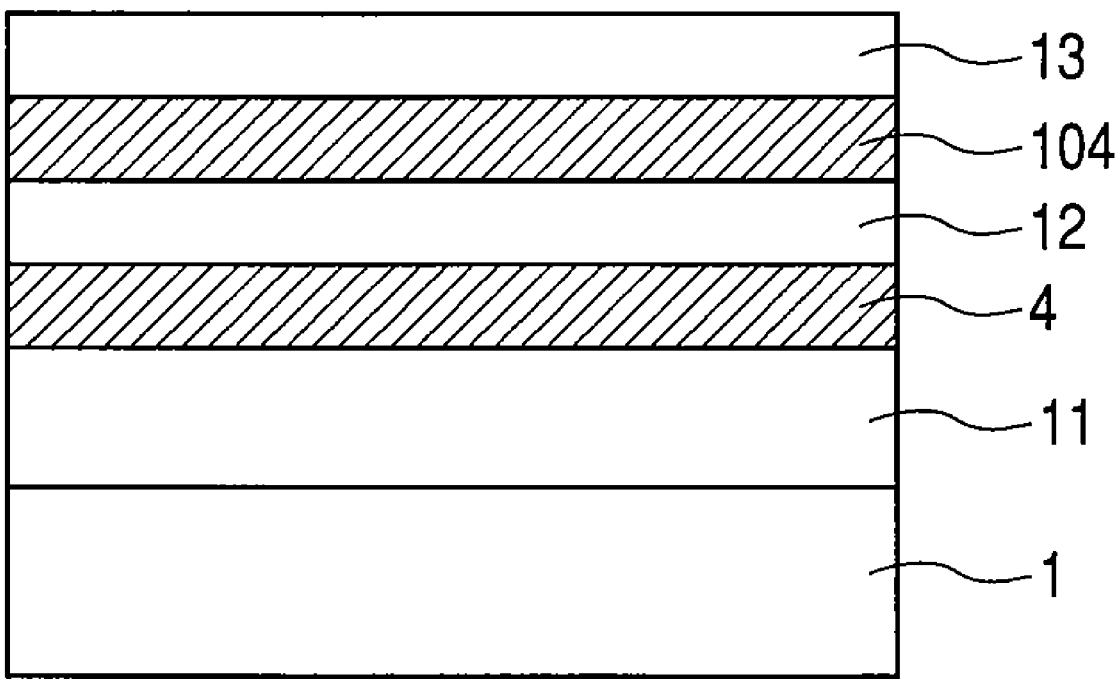
FIG. 28B is a fragmentary cross sectional view showing one example of the method for producing the semiconductor device of the sixth embodiment.
Figure 29A:
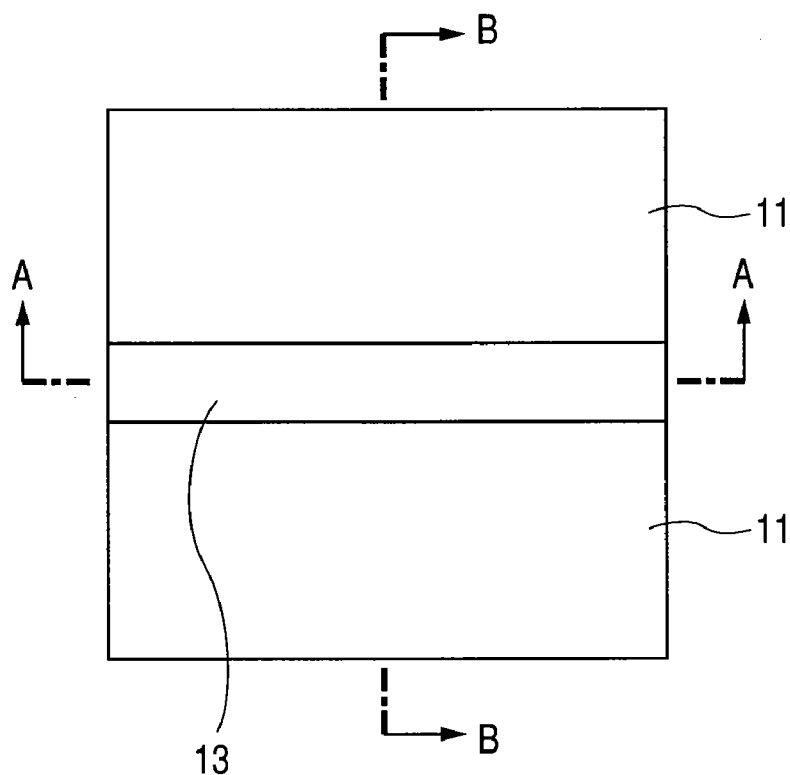
FIG. 29A is a fragmentary flat view showing one example of the method for producing the semiconductor device of the sixth embodiment.
Figure 29B:
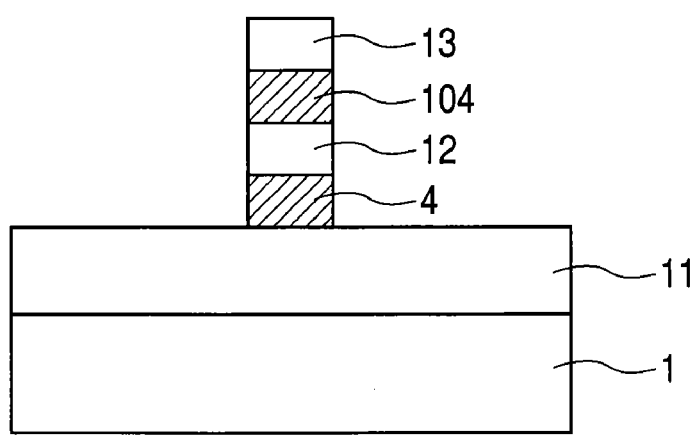
FIG. 29B is a fragmentary cross sectional view showing one example of the method for producing the semiconductor device of the sixth embodiment, and is taken along the lines B-B of FIG. 29A.

A semiconductor substrate 1 is first of all prepared (FIG. 28A). An insulator film 11 is then deposited to approximately 200 nm and a tungsten electrode 4, insulator film 12, tungsten film 104 and insulator film 13 are for example deposited by the CVD method to a depth of approximately 100 nm (FIG. 28B). The tungsten electrode 4, insulator film 12, tungsten film 104 and insulator film 13 are next patterned in stripe shapes by the lithography and dry etching methods. FIG. 29A is a flat view showing this state. FIG. 29B is a cross sectional view taken along lines B-B in FIG. 29A.

Figure 30A:
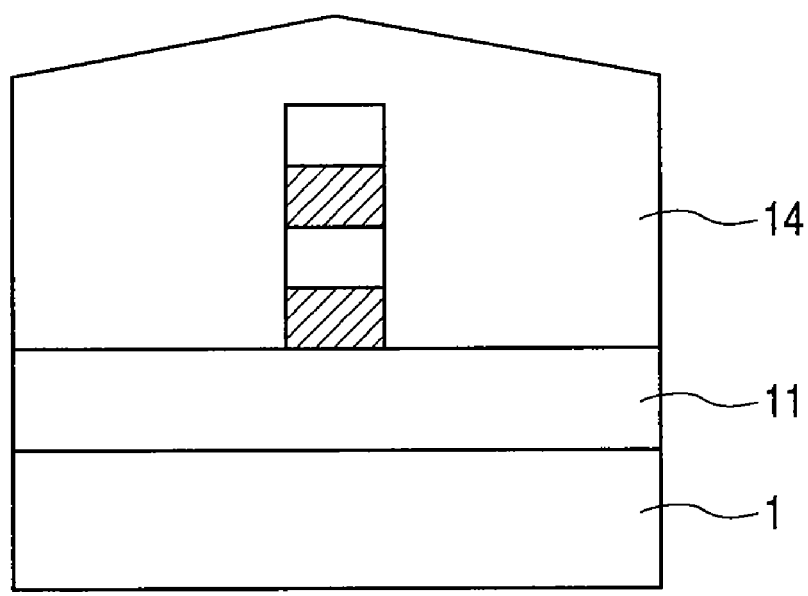
FIG. 30A is a fragmentary cross sectional view showing one example of the method for producing the semiconductor device of the sixth embodiment.
Figure 30B:
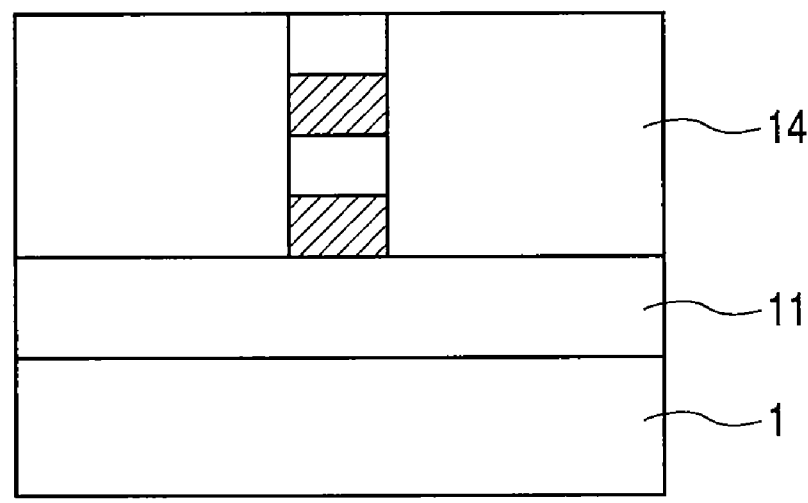
FIG. 30B is a fragmentary cross sectional view showing one example of the method for producing the semiconductor device of the sixth embodiment.
Figure 31:
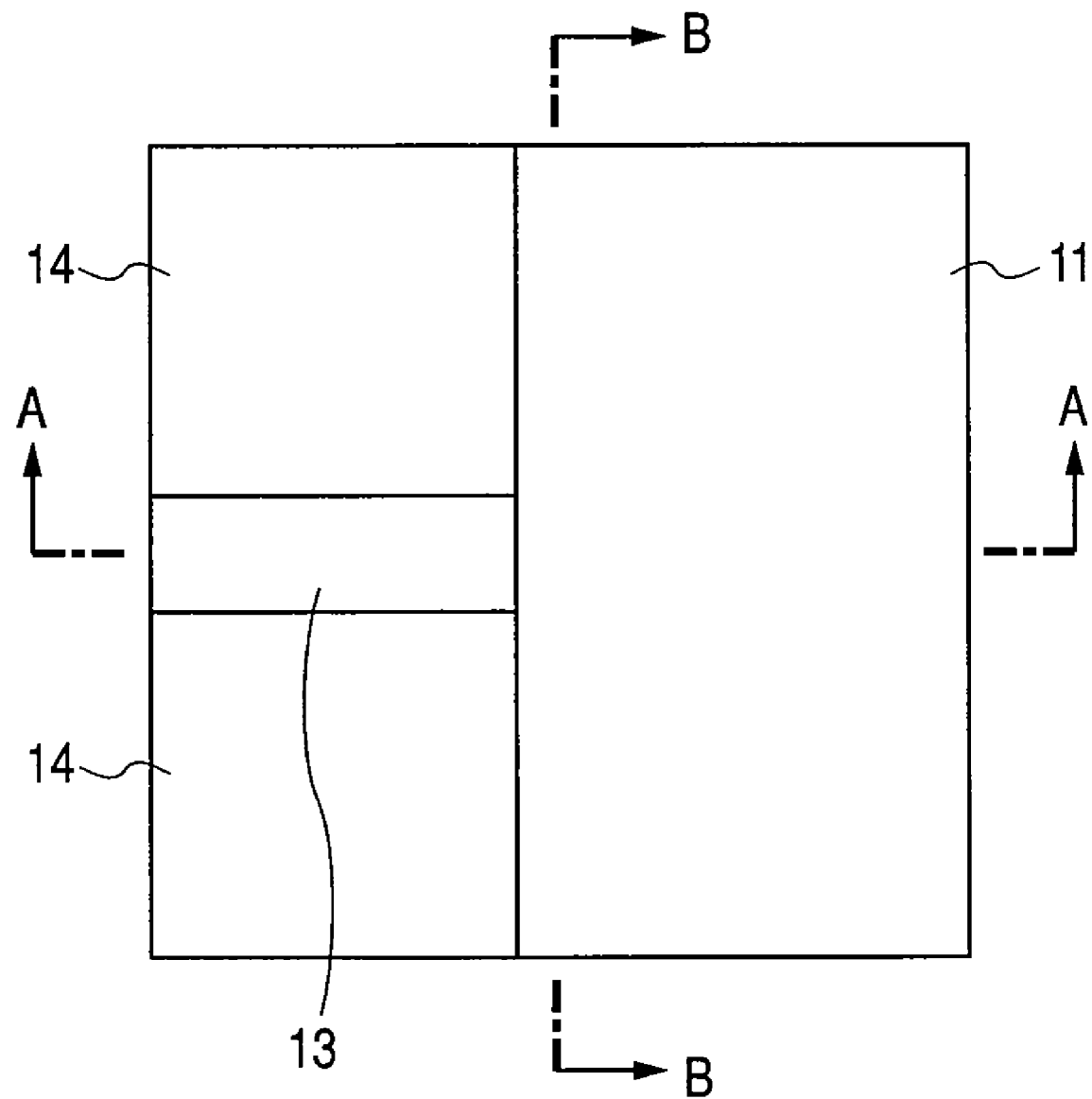
FIG. 31 is a fragmentary flat view showing one example of the method for producing the semiconductor device of the sixth embodiment.

An insulator film 14 is next deposited to full bury the tungsten electrode 4, insulator film 12, tungsten film 104 and insulator film 13 that were patterned in stripe shapes (FIG. 30A). A portion of the insulator film 14 is next stripped away using the CMP method, to expose the upper surface of the insulator film 13 (FIG. 30B).

Figure 32A:
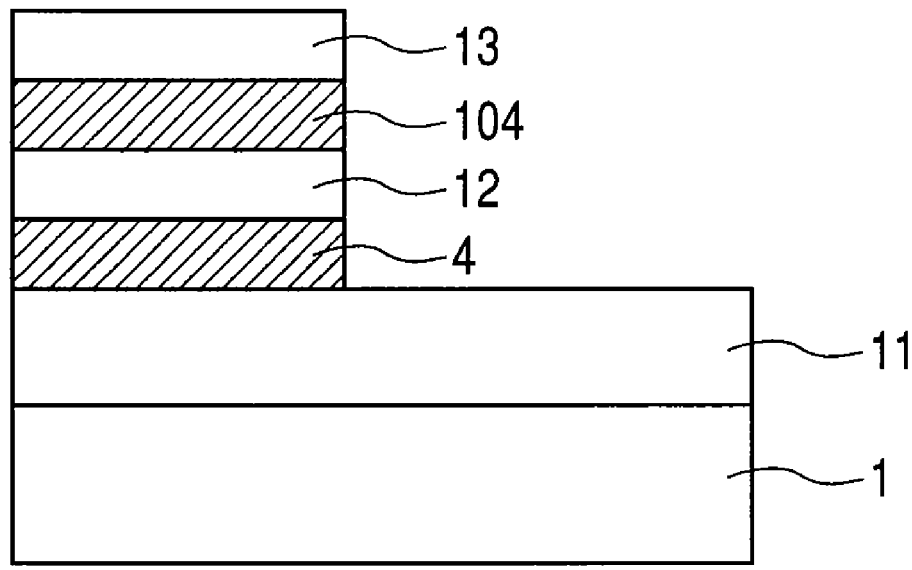
FIG. 32A is a fragmentary cross sectional view showing one example of the method for producing the semiconductor device of the sixth embodiment, and taken along lines A-A of FIG. 31.
Figure 32B:
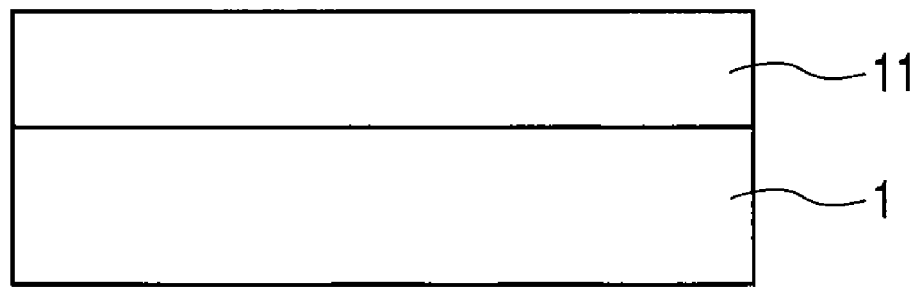
FIG. 32B is a fragmentary cross sectional view showing one example of the method for producing the semiconductor device of the sixth embodiment, and taken along lines B-B of FIG. 31.

The laminated film is then patterned in strips by lithography and dry etching techniques. This stage is shown in the flat view in FIG. 31. FIG. 32A is a cross section taken along lines A-A of FIG. 31. FIG. 32B is a cross sectional view taken along lines B-B of FIG. 31.

Figure 33A:
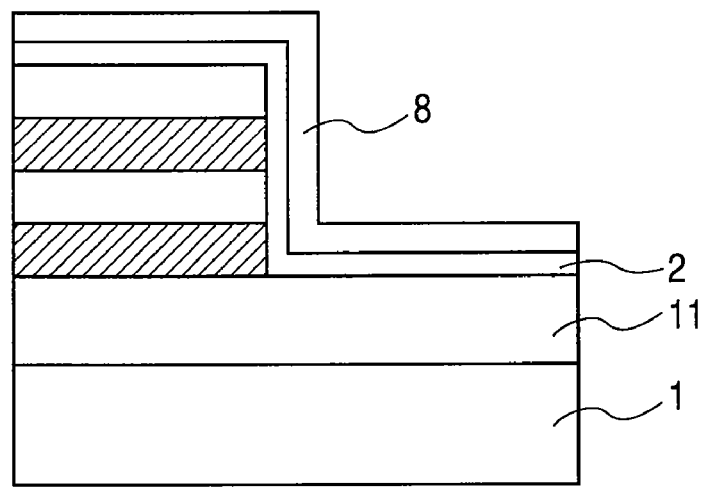
FIG. 33A is a fragmentary cross sectional view showing one example of the method for producing the semiconductor device of the sixth embodiment.

The solid electrolyte 2, and the low-resistance solid electrolyte 8 containing a higher concentration of copper than the solid electrolyte 2, is deposited by the sputter method or the CVD method (FIG. 33A). The thickness of the solid electrolyte 2 and the solid electrolyte 8 are at this time made equivalent to the thickness of the tungsten film 4.

Figure 33B:
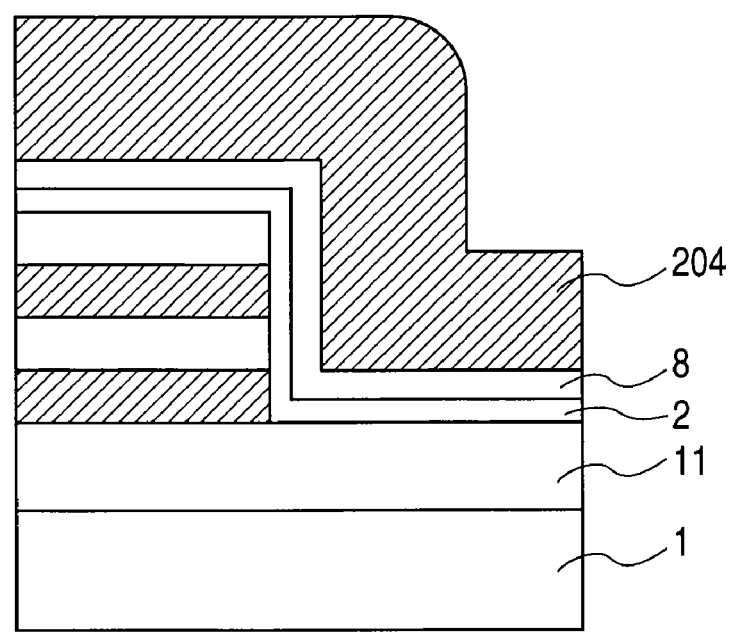
FIG. 33B is a fragmentary cross sectional view showing one example of the method for producing the semiconductor device of the sixth embodiment.
Figure 34A:
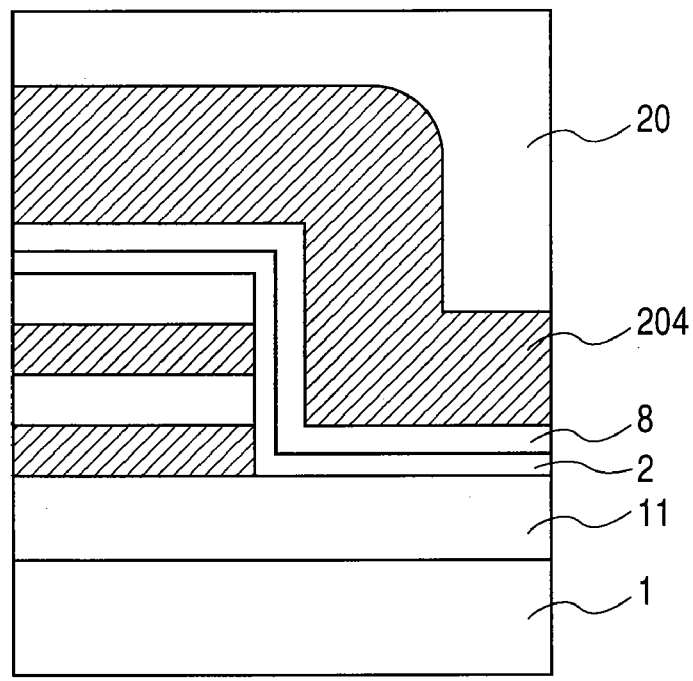
FIG. 34A is a fragmentary cross sectional view showing one example of the method for producing the semiconductor device of the sixth embodiment.

The tungsten film 204 is next deposited for example by the sputter method (FIG. 33B). A photo resist 20 is next coated on (FIG. 34A).

Figure 34B:
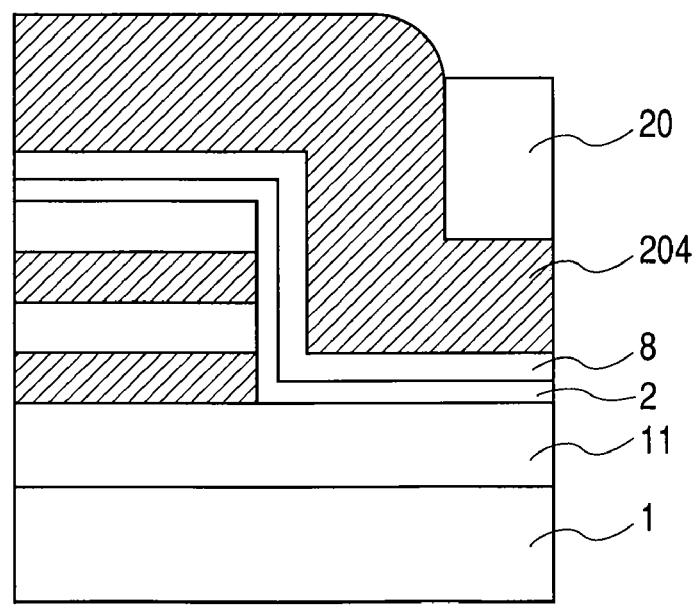
FIG. 34B is a fragmentary cross sectional view showing one example of the method for producing the semiconductor device of the sixth embodiment.
Figure 35A:
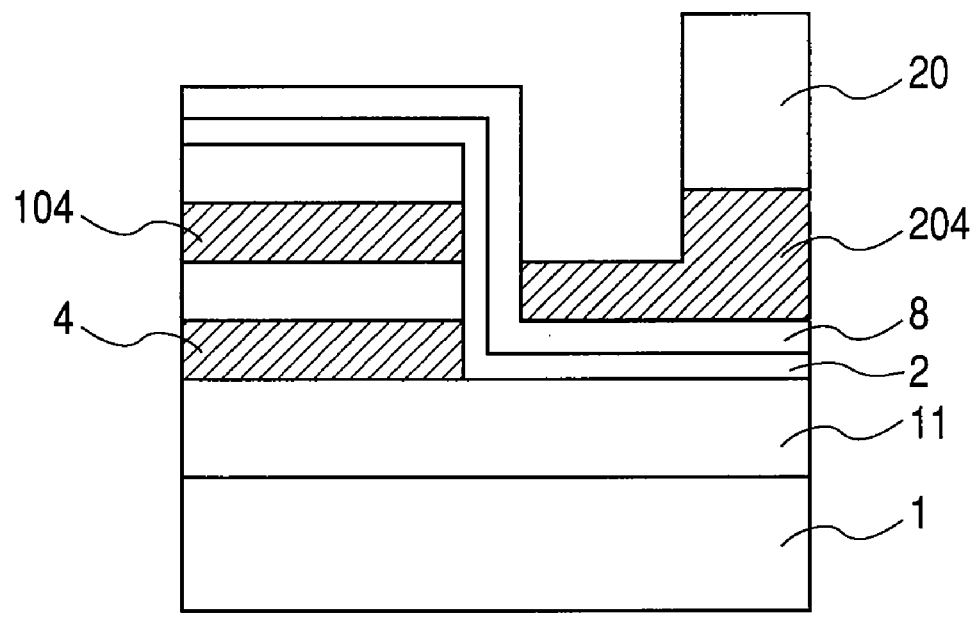
FIG. 35A is a fragmentary cross sectional view showing one example of the method for producing the semiconductor device of the sixth embodiment.
Figure 35B:
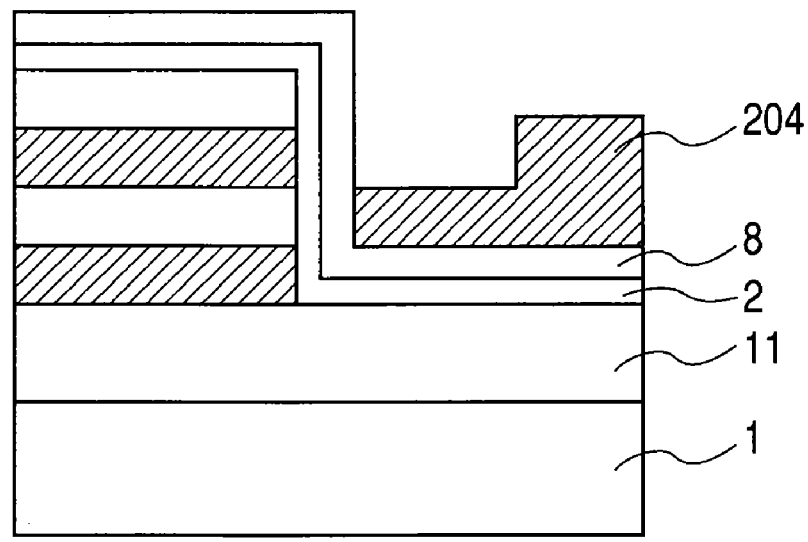
FIG. 35B is a fragmentary cross sectional view showing one example of the method for producing the semiconductor device of the sixth embodiment.

A portion of the photo resist 20 is next stripped away by etch-back to expose the surface of the tungsten film 204 (FIG. 34B). Next, just the tungsten film 204 is selectively stripped away by etching so that the height of the section in contact with the solid electrolyte 8 is approximately equal to the bottom surface of the tungsten film 104 (FIG. 35A). The state in FIG. 35B is attained when the photo resist is removed.

Though not shown in the drawing, after forming the interpoly dielectric film, contact holes extending to the three tungsten electrodes 4, 104, 204, as well as contact holes for the semiconductor circuit formed on the semiconductor substrate 1 are then formed, and metallic films then deposited to form wiring to complete the semiconductor device.

The semiconductor device of this embodiment is a nonvolatile switch also possessing a small surface area due to the simple structure. Compared to the volatile switch of the related art with its large surface area using CMOS, the semiconductor device of this invention is superior both in terms of production costs and functions.

Seventh Embodiment

Figure 36A:
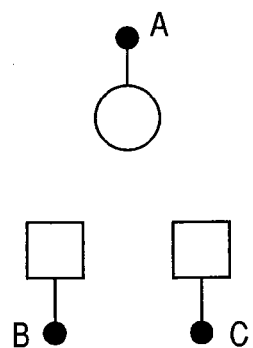
FIG. 36A is a drawing expressing the semiconductor device with symbols for making up the semiconductor device array of the seventh embodiment.
Figure 36B:
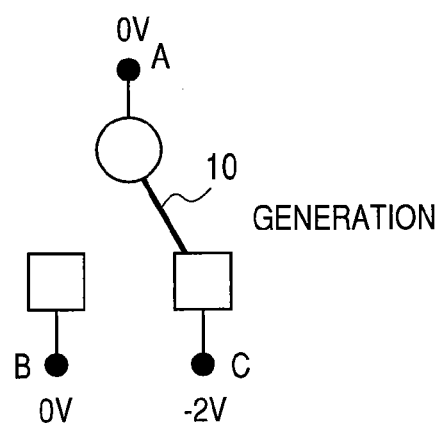
FIG. 36B is a drawing showing the switch-on operation between the electrode A and the electrode C of the semiconductor device making the array for the semiconductor device of the seventh embodiment.
Figure 36C:
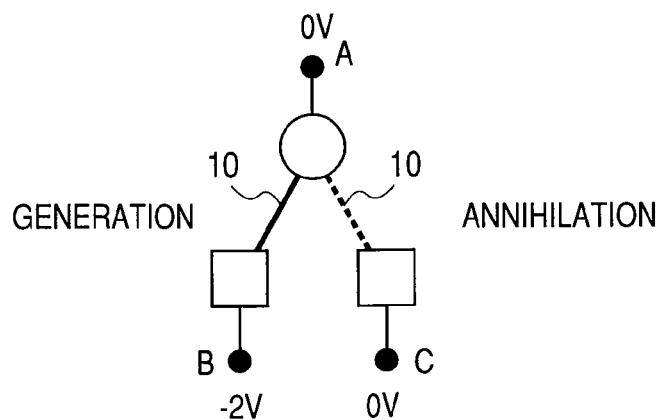
FIG. 36C is a drawing showing the operation for switching the conductive path between electrode A to electrode C; to the electrode A to electrode B for the semiconductor devices making up the array for the semiconductor device of the seventh embodiment.
Figure 37:
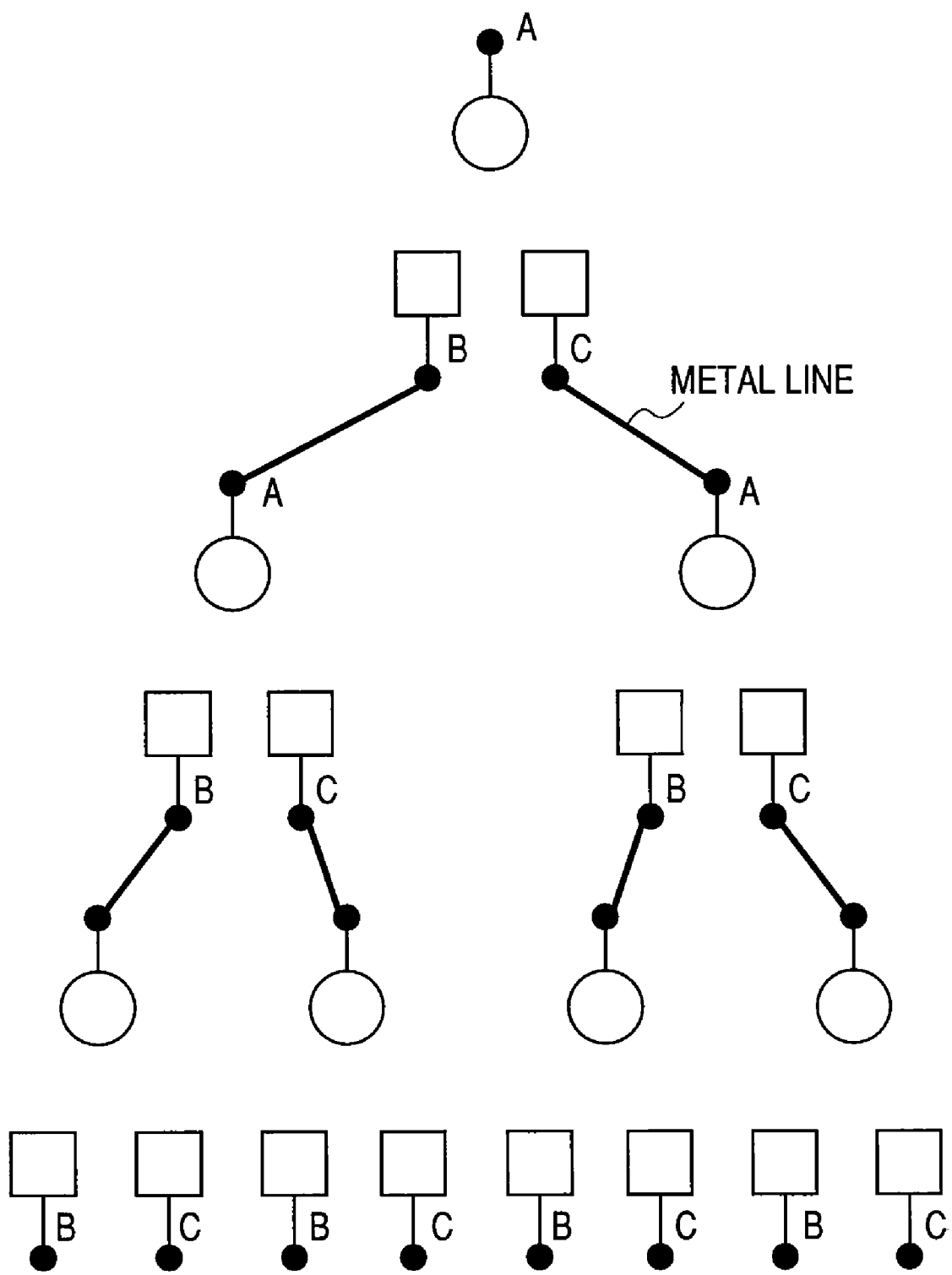
FIG. 37 is a drawing showing an example of the array structure of the semiconductor device of the seventh embodiment.

The semiconductor devices from the first through the sixth embodiments are written as symbols in FIG. 36A. The positive electrode is shown with a ○ and the negative electrode with a □ during forming of the conductive path (during the switch-on operation). FIG. 36B shows the switch-on operation between the electrodes A-C. FIG. 36C shows the operation when switching the conductive path from electrodes A-C, to the electrodes A-B. An array can be made by using multiple semiconductor devices of this type, where positive electrodes during forming of conductive paths for the semiconductor device as shown in FIG. 37, are connected by metallic lines (wiring layer) to negative electrodes during forming of conductive paths of other semiconductor devices.

Figure 38:
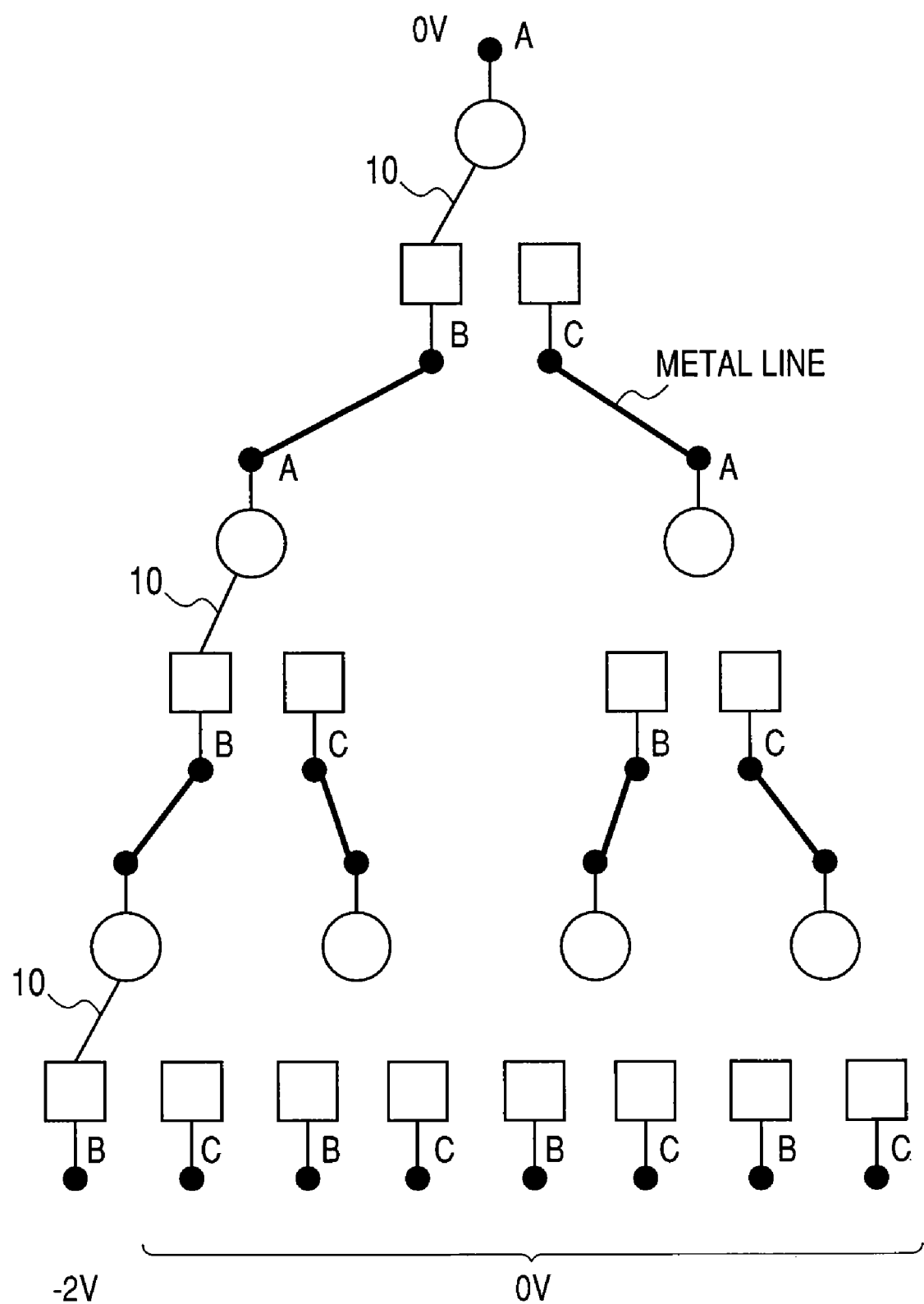
FIG. 38 is a drawing showing an example of the operation for switching the conductive path in the semiconductor device of the seventh embodiment.
Figure 39:
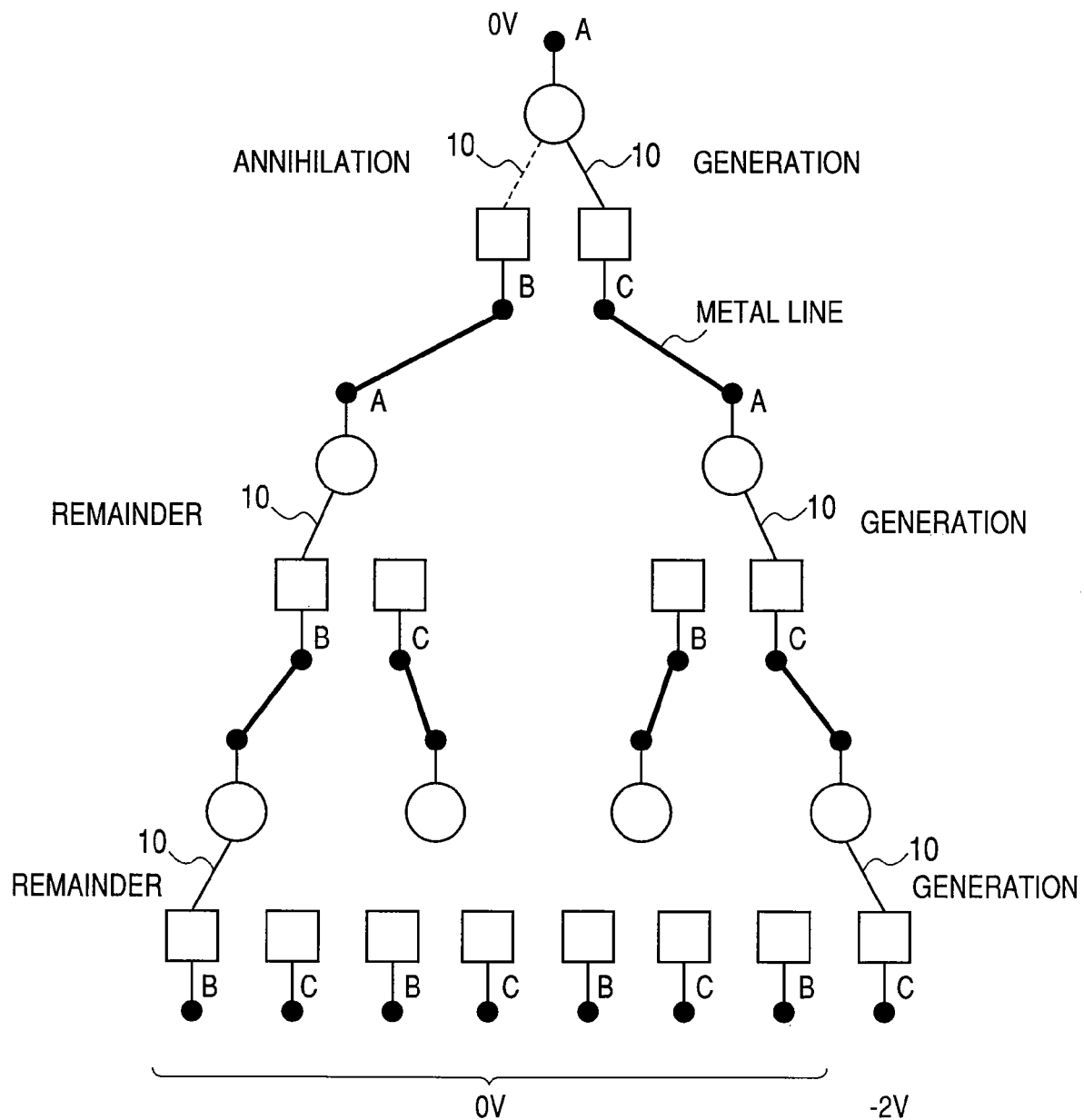
FIG. 39 is a drawing showing an example of the operation for switching the conductive path in the semiconductor device of the seventh embodiment.

Multiple long distance conductive paths can be simultaneously formed within multiple semiconductor devices as shown in FIG. 38 by applying for example −2 volts to one electrode of the semiconductor device. The conductive paths can also be eliminated at certain points and the long distance conductive path switched simultaneously with generating a new conductive path by applying for example −2 volts to a separate electrode as shown in FIG. 39, in the state where a conductive path is generated as shown in FIG. 38.

The semiconductor device of this embodiment is ideal for instantaneously changing multistage logic switching.

Eighth Embodiment

A switching phenomenon that moves metals such as copper (Cu) and silver (Ag) within the solid electrolyte to generate or eliminate these copper or silver filaments resembles the generation and annihilation of synaptic couplings of neurons as seen in the brain neocortex. These synaptic couplings convey the voltage pulse oscillation state in the neurons to a neuron at the other end of the connection. However this neural connection becomes stronger or weaker according to how frequently this excitation state is conveyed. This change in the connection intensity can be considered equivalent to learning. The synaptic coupling of neurons can be mimicked by connecting the switching devices such as in the embodiments 1 through 6 together.

Neurons are capable of multiple inputs in the respect that one neuron connects to multiple (several thousand to 50/60 thousand) nerve synapses. Also, though there is only one axon (nerve fiber) per neuron to convey the excitation state to other neurons, there are many branches along the way so the neuron is capable of multiple outputs in the respect that the tip of one branch connects the synapse to other neurons.

Figure 40:
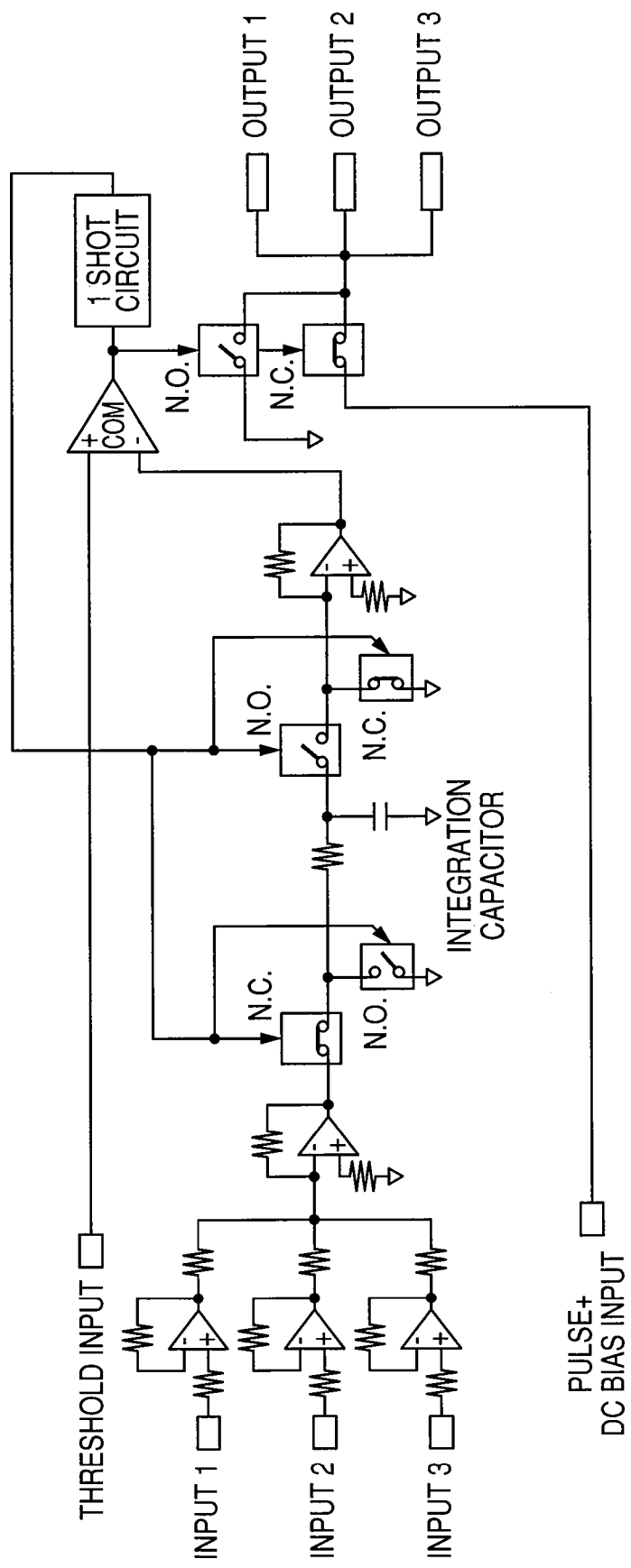
FIG. 40 is a circuit diagram of the cell emulating the neuron.

A circuit for mimicking the multiple inputs and multiple outputs with pulse voltages can be contrived as shown for example in FIG. 40. The circuit in FIG. 40 is equivalent to one neuron, and pulse voltages from circuits mimicking other neurons are input to the inputs 1, 2, 3.

This cell circuit (circuit corresponding to a nerve cell) includes: a block (near the integration capacitor) for integrating multiple inputs; a comparator circuit block (near the threshold input) capable of applying an external threshold corresponding to the nerve cell function or type; a pulse waveform from a pulse generator; a circuit block (near the input for "input corresponding to nerve transmitter substance") for inputting the sum of the DC bias corresponding to the total effective quantity of nerve transmitter substance whose general purpose is to externally raise and lower the neuron area excitation level; a circuit block (center of the figure for controlling switches in the with output signals from the comparator circuit block) for converting an integrated value of the input to the time that the output pulse train continues); a circuit to set the idle time after the pulse train ends in a one-shot circuit, and a branch output block (Outputs 1 to 3) for connecting to the ion switches. The capacitor charges during the one-shot pulse, and multiple switches simultaneously switch when the one-shot ends so that the voltage level from the input integration value momentarily exceeds the comparator level, causing output of a pulse sufficiently long to form a stable ion conducting path in the ion switch connecting to the output, until the comparator level drops after a time corresponding to the charge stored in the integration capacitor is discharged by a parallel resistor.

One op amp is placed at each input and output for impedance matching so there is no need to consider other circuits beforehand. If the op-amps on the input and output sides are removed, and several of the branches on the output were connected by an ion switch to other neuron circuits, then the input side of the neuron circuit that is the connection destination is held at a high voltage level so no current flows there, but current does flow to unconnected neurons and an ion connection is established. This circuit differs from conventional neural networks in the point that joint use of cell circuit connections for different processing is avoided as much as possible.

Synapse connections are securely made in the order of first come first serve, and effective connections survive while meaningless connections are gradually eliminated to optimize connections. In an actual neural network, when valid signals are judged in an ascending hierarchy as suitable for transmission, the effective total quantity of neural transmitter substance in that network area is then increased as a form of reward, and the blood flow in that area increased via an existing activation feedback structure so that the synapse connection is intensified. The above described neural transmitter substance circuit block fulfills the activation task via input of this feedback. This task resembles the network teacher signal in a conventional neural network but differs in the point that it activates an area rather than making a pass/fail decision and applying it to the input of a separate cell circuit.

The reward applied to the neural transmitter substance block per the ascending hierarchy may be supplied to a cell circuit group within a pre-determined range, and can be transmitted to mutual cell circuits within the applicable network area even if there is some difference in the actual range of the network area for activation, so the correct area will be activated. The waveform that is input to this circuit block is made up of a pulse voltage generated in a block for unified handling of adjacent cell circuits, and a DC bias voltage corresponding to that reward. In an actual neuron a pulse is output when the equivalent of the cell circuit sends a burst but in an electronic circuit, the phase differential might cause an unstable state where undulations occur, or strong noise is generated.

The DC bias voltage is nearly zero when forming the initial ion connection so the positive voltage and the negative voltage act alternately when attempting to form an ion conducting path in the section corresponding to the synapse. However the shape and material of the electrode are asymmetrical so the carrier amplified from the ion impact during the positive voltage causes a relative large amount of current to flow and due to that effect an ion conducting path though weak, is formed and maintained. A network having the desired logic processing will be able to strengthen that ion conductive path by applying the reward DC bias voltage. That increase will correspond to the strength of the synapse connection. The DC bias voltage is capable of strengthening ion connections that are already present but are not a significant value for generating new connections.

The comparator circuit block on the other hand, is capable of setting to the excitation state and sending an output based on one among multiple inputs, or outputting multiple excitation states, or in other words is capable of processing resembling that of an OR or NAND digital logic circuit. A cell circuit that provides no output is essential in order to prevent confusion due to complications arising from too much information being processed in the network for the cell circuits.

The cell circuit in the figure was confirmed capable of operation one digit ranger higher or more than an actual neuron. In this testing, a negative voltage was applied as the DC bias voltage for the corresponding nerve transmitter substance.

The output waveform for this circuit corresponds to the excitation state called a neuron burst (for example in the text in http://www.sat.t.u-tokyo.Ac.Jp/~kohno/lecturenotes/~ohpj071 130.pdf, Intro to Neuroscience: Neuromorphic hardwares, P. 18/27) where a pulse string is output for a specified time. The input to the comparator may be a fixed input or a repetitive rectangular waveform may be input. The output waveform of an actual neuron is large in the positive direction and small in the negative direction and so is positively and negative asymmetrical. However, the prototype circuit output waveform is fundamentally dependent on the pulse waveform input to the neural transmitter substance block and can therefore be synchronized with the pulse voltage waveform generated during neuron excitation. If for example mimicking only the burst that is output from the neuron, then the output signal may fluctuate somewhat, but two or more input signals from other than the "Input" may be processed as one signal.

An example of an STDP (synapse timing delay pulse circuit) cell circuit of the related art that gives priority to the input pulse timing is disclosed (for example in non-patent document 3). In these specifications, the individual pulses that make up the burst are mostly synchronized since the pulses are applied from the same pulse oscillator circuit in the cell circuit for a specified area such as the area matching the column serving as the tiny rod structure of the neurocortex. However, the beginning and the end of the burst will vary depending on the individual cell circuit. Therefore, by making the synchronization of these burst phases a significant factor, brain functions can be simulated such as overall decision based on the multiple synchronized phase inputs to the neurons of the prefrontal cortex (or region) of the brain.

The connection to the section corresponding to the synapses is described next.

There are at least two patterns for movement of the metallic ion boundary within the fixed electrolyte.

One pattern is where metallic positive ions can move easily within the solid electrolyte or in other words a pattern providing high mobility. In this case, a path with a high concentration of metallic ions cannot be formed at first, and when a large quantity of metallic ions are deposited on the other electrode or in other words the negative electrode, a conductive path is formed when that peak reaches the positive electrode. In the other pattern, the metallic positive ions cannot move easily.

The metallic ions in this case pressed into a location in the film with many relative gaps, to form a filament shaped conductive path. The latter pattern is considered suitable for simulating synapse connections. Ion switch arrays contain two electrode pairs with overlapping electrical fields and so can perform an operation where during connection to one electrode pair while already connecting to another pair, the lateral electrical field can be used to cut the original connection. The outputs from other cell circuits connect to these electrode pairs. The base electrode of an opposing electrode pair connects to cell circuit input in the next layer.

Many electrode pairs are usually formed at positions equivalent to the peak of the polygon above and diagonal to the base electrode, and one or desired multiple electrodes are connected along the ion conductive path, to allow even more possible connections.

The cell circuit of this invention is ideal for operating ion switches for the following reasons.

1. A pulse string is emitted as a burst with positive and negative voltage swings so that moving the ions in the solid electrolyte to form a conductive path is easy.

2. A DC bias can be set on the input corresponding to the nerve transmitter substance to decide whether to form or eliminate a conductive path.

3. If the op-amp is omitted on the input, then no voltage differential will occur between the subject cell circuit and the input electrode on the cell circuit where a charge from an integrating capacitor has already accumulated so that ion connections are automatically made to unused cell circuits.

Figure 41:
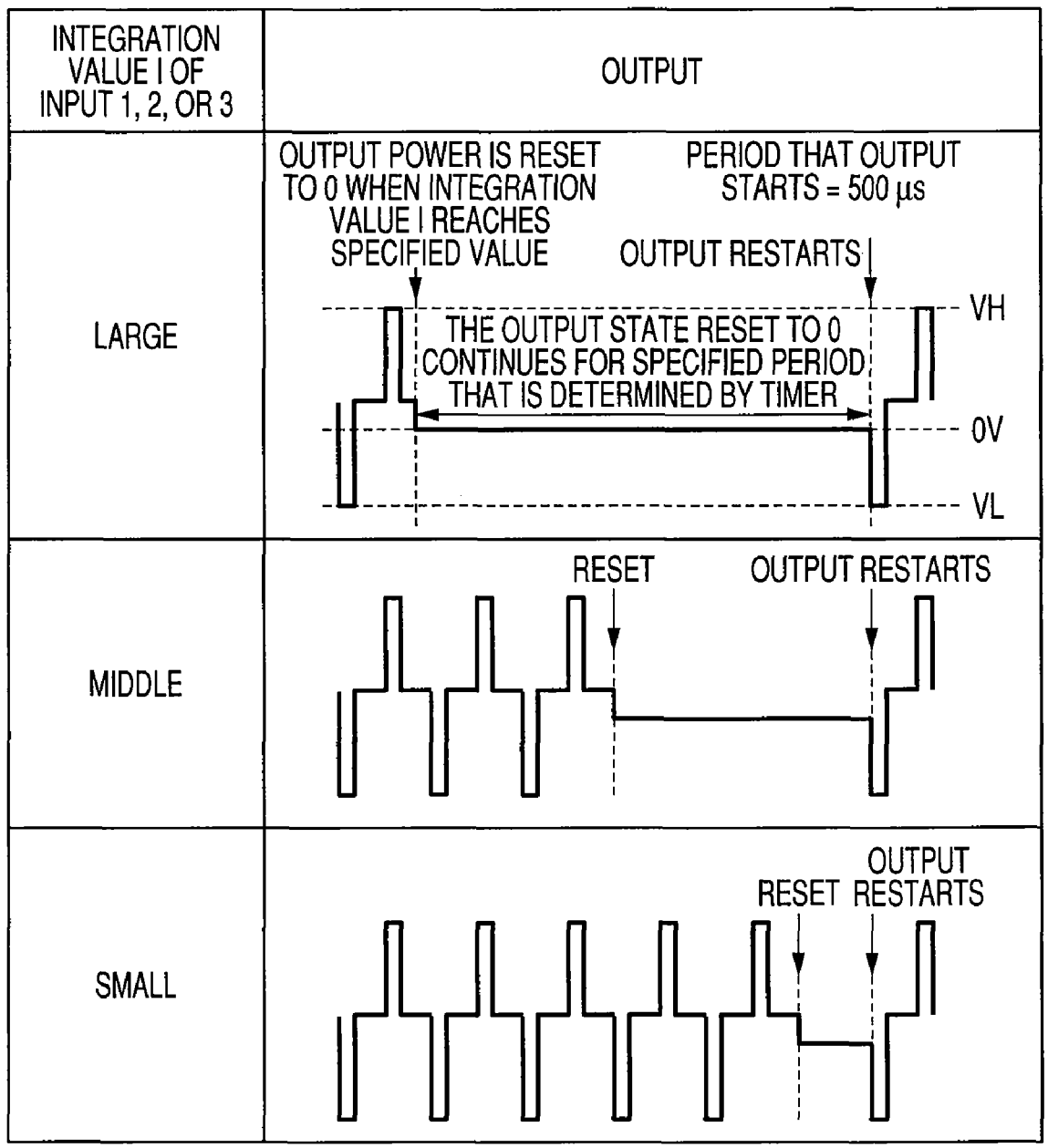
FIG. 41 is a drawing showing the input/output relation in the circuit of FIG. 40.

The voltage applied to the switching element on the solid electrolyte and the circuit output waveform can be set as shown in FIG. 41, according to the integration value of an input pulse set to a fixed time.

This output pulse in the same way, forms the input for the next contrived circuit. Operating this circuit containing the multiple mutually connected circuits allows varying the resistance of the solid electrolyte switching element in each circuit. The change in resistance depends on the thickness of the metallic filament formed in the solid electrolyte. This change in resistance can be considered as learning.

Connecting these types of circuits on a large circuit scale allows implementing the higher functions of the neocortex in the human brain.

The semiconductor device of this invention will prove ideal for use in switching sections of typical logic devices. In the future this semiconductor device will prove ideal for emulating brain functions.

What is claimed is:

1. A semiconductor device comprising:
  a first electrode formed on a semiconductor substrate;
  at least two second electrodes including a first metal and formed opposite the first electrode;
  first and second solid electrolyte films interposed between the first electrode and the at least two second electrodes, the second solid electrolyte film including a second metal different from the first metal; and
  a low-resistance conductive path formed in the first solid electrolyte film when a voltage is applied to ionize the second metal to cause ions to move in the first solid electrolyte film from the second solid electrolyte film and deposit along the movement path.

2. The semiconductor device according to claim 1,
  wherein the low-resistance conductive path is a metallic filament containing the second metal.

3. The semiconductor device according to claim 2,
wherein the low-resistance conductive path is nonvolatile and is continuously retained without applying a voltage across the first electrode and the at least two second electrodes.

4. The semiconductor device according to claim 1,
wherein the second metal is copper.

5. The semiconductor device according to claim 1,
wherein the second metal is silver.

6. The semiconductor device according to claim 1,
wherein the first electrode further comprises a third metal which is tungsten or tantalum, and the second metal is copper or silver.

7. The semiconductor device according to claim 1,
wherein at least a portion of the lower section of the first electrode is provided in contact with the second solid electrolyte film.

8. The semiconductor device according to claim 1,
wherein at least one of the first electrode and the second electrode is formed as a line or plug embedded in an insulator film formed on the semiconductor substrate.

9. The semiconductor device according to claim 1,
wherein at least one of the first electrode and the second electrode contain a barrier metal at the boundary of an insulator film formed in contact with the first and second electrodes for suppressing the diffusion of metals contained in the first and the second electrodes into the insulator film.

10. The semiconductor device according to claim 9,
wherein the barrier metals are Ti, TiN, Ta, or TaN.

11. The semiconductor device according to claim 1,
wherein at least a portion of each of the side wall of the at least two second electrodes is provided in contact with the first solid electrolyte film and a portion of a side wall of the first electrode is provided in contact with the second electrolyte film.

* * * * *